(12) United States Patent
Koc et al.

(10) Patent No.: US 7,706,089 B2
(45) Date of Patent: Apr. 27, 2010

(54) LENS DRIVING DEVICE

(75) Inventors: Burhanettin Koc, Gyunggi-do (KR);
Jung Wook Hwang, Busan (KR);
Byung Hoon Kang, Seoul (KR); Hyun Phill Ko, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 162 days.

(21) Appl. No.: 12/000,923

(22) Filed: Dec. 18, 2007

(65) Prior Publication Data

US 2008/0144201 A1    Jun. 19, 2008

(30) Foreign Application Priority Data

Dec. 19, 2006    (KR) ...................... 10-2006-0130488

(51) Int. Cl.
*G02B 7/02* (2006.01)
(52) U.S. Cl. ...................... 359/824; 359/819
(58) Field of Classification Search ......... 359/819–824; 310/323.01–323.17
See application file for complete search history.

(56) References Cited

U.S. PATENT DOCUMENTS

| 5,768,038 | A | 6/1998 | Emura |
| 6,215,605 | B1 | 4/2001 | Kuwana et al. |
| 2008/0084620 | A1* | 4/2008 | Lee et al. ..................... 359/824 |
| 2009/0067069 | A1* | 3/2009 | Matsumoto ................. 359/824 |

FOREIGN PATENT DOCUMENTS

| EP | 1 753 121 | | 2/2007 |
| EP | 1 795 933 | | 6/2007 |
| GB | 2 431 478 | | 4/2007 |
| GB | 2 435 527 | | 8/2007 |
| GB | 2435527 | A * | 8/2007 |
| JP | 10-90584 | | 4/1998 |

OTHER PUBLICATIONS

Search Report issued in corresponding UK Patent Application No. GB0724386.8; mailed on Apr. 1, 2008.

* cited by examiner

*Primary Examiner*—Mohammed Hasan

(57) ABSTRACT

A lens driving device including: a lens barrel having at least one lens therein and provided with a friction member; a housing for housing the lens barrel therein; an actuator having a piezoelectric body disposed at an edge of the housing to apply a driving force, the piezoelectric body having at least one output member provided at one side thereof to be in contact with the friction member; a preload member disposed between the edge of the housing and the actuator to apply an elastic force toward the lens barrel; and a guiding part disposed between the housing and the lens barrel to guide the lens barrel to move in an optical axis direction. The lens driving device is simplified in a driving mechanism and thus reduced in size, while experiencing minimum loss of a driving power and ensuring more accurate and stable movement of the lens.

34 Claims, 17 Drawing Sheets

LENS DRIVING DEVICE

CROSS-REFERENCE TO RELATED APPLICATIONS

This application claims the priority of Korean Patent Application No. 2006-130488 filed on Dec. 19, 2006, in the Korean Intellectual Property Office, the disclosure of which is incorporated herein by reference.

BACKGROUND OF THE INVENTION

1. Field of the Invention

The present invention relates to a lens driving device employed in an optical device, and more particularly, to a lens driving device which is simplified in a driving mechanism to achieve a smaller size, minimized in loss of a driving force for driving a lens and ensures more accurate and stable movement of the lens.

2. Description of the Related Art

In general, an optical apparatus includes a lens driving device for driving a lens using a cam structure, a screw or a piezoelectric element. The lens driving device employs a motor or the piezoelectric element to generate a driving force and the cam structure or the screw to transmit the driving force.

Therefore, the lens driving device drives the lens to change a relative distance of the lens, thereby performing zooming or focusing.

U.S. Pat. No. 5,768,038 discloses a device for moving a lens including a lens frame, a signal generator, a piezoelectric vibrator, a supporter, a pressure surface and a pressure member. The guiding member guides a lens frame. The signal generator generates an electrical signal. The piezoelectric vibrator moves the lens frame along the guiding member by vibration according to the electrical signal. The supporter supports the piezoelectric vibrator. The pressure surface is in pressure contact with the piezoelectric vibrator. The pressure member brings the piezoelectric vibrator into pressure contact with the pressure surface.

However, this conventional device requires the guiding member to be additionally assembled so that the lens frame is moved in an optical axis direction. This complicates an assembling structure and a process, and hinders miniaturization of the product.

Moreover, U.S. Pat. No. 6,215,605 discloses a driving device. In the driving device, piezoelectric devices are fixed to a base block and a driving force is transferred to driving rods. Then, a lens is moved by a pressure generated from a slide part, an inertial force of a lens frame and acceleration effects. The lens frame is transferred along with the driving rods according to a waveform of an input voltage or performs slidable relative motion, thereby enabling the driving device to reciprocally move the lens.

However, in this conventional device, the driving rods are fixed so that a length of barrel cannot be changed. This accordingly is an impediment to reduction in size. Also, a driving signal of the device is an asymmetrical wave signal, not a sine wave signal, thereby complicating a driving circuit.

Therefore, there is a need for a lens driving device which can be mounted in a small volume, controlled precisely due to high driving resolution, while operating with a small driving power and achieving a sufficient driving distance.

SUMMARY OF THE INVENTION

An aspect of the present invention provides a lens driving device which is more simplified in structure to achieve miniaturization thereof.

An aspect of the present invention also provides a lens driving device which attains a big driving distance with a lower input voltage, thereby ensuring superior driving resolution and minimal loss of a driving force.

An aspect of the present invention also provides a lens driving device which is simplified in a guide mechanism for guiding movement of a lens and moves the lens to move accurately and stably.

According to an aspect of the present invention, there is provided a lens driving device including: a lens barrel having at least one lens therein and provided with a friction member; a housing for housing the lens barrel therein; an actuator having a piezoelectric body disposed at an edge of the housing to apply a driving force, the piezoelectric body having at least one output member provided at one side thereof to be in contact with the friction member; a preload member disposed between the edge of the housing and the actuator to apply an elastic force toward the lens barrel; and a guiding part disposed between the housing and the lens barrel to guide the lens barrel to move in an optical axis direction.

The lens barrel may have a groove formed in an outer surface thereof corresponding to the output member to have the friction member disposed therein.

The housing may have an insertion part formed at an edge corresponding to the friction member of the lens barrel to have the actuator and the preload member inserted therein.

The preload member may include at least one leaf spring having upper and lower ends in contact with the edge of the housing and a center bent to contact the actuator.

The preload member may have a protrusion formed on a center thereof to be in point contact with the actuator.

The preload member may include at least one coil spring having one end in contact with the edge of the housing and another end in contact with the actuator.

The preload member may have one end fixed to one of the housing and the actuator.

The preload member may come in contact with an outer surface of the actuator corresponding to a longitudinal center thereof.

The guiding part may include: a pair of barrel guiders extended from an outer surface of the lens barrel toward the housing; a pair of housing guiders extended from an inner surface of the housing toward the lens barrel; and a pair of bearing members disposed between the barrel guiders and the housing guiders, respectively.

Each of the bearing members may include: at least one ball member being in point contact with the outer surface of a corresponding one of the barrel guiders and an outer surface of a corresponding one of the housing guiders; and a retainer having a ball receiving groove where the ball member is rotatably disposed.

The barrel guider in contact with the ball member may have a vertical surface.

The housing guider in contact with the ball member may have a vertical surface.

A contact point among an optical axis of the lens barrel, the friction member and the output member and a contact point between the preload member and the actuator may be arranged along a virtual line.

The friction member and bearing members disposed at both sides thereof may be arranged along a virtual line.

The housing may have a location sensor disposed on an inner surface thereof to detect vertical movement of a sensing part provided on an outer surface of the lens barrel.

The housing may be provided on a top thereof with a cover having an opening for exposing the lens to the outside.

The housing may be provided on a bottom thereof with a board having an image sensor mounted thereon.

The guiding member may include: a pair of barrel guiders extended from an outer surface of the lens barrel toward opposing edges of the housing, respectively; a pair of housing guiders extended from the opposing edges of the housing toward the lens barrel, respectively; and a pair of bearing members disposed between the barrel guiders and the housing guiders, respectively.

Each of the bearing members may include: at least one ball member being in point contact with an outer surface of a corresponding one of the barrel guiders and an outer surface of a corresponding one of the housing guiders; and a retainer having a ball receiving groove where the ball member is rotatably disposed.

The each of the barrel guiders opposing the bearing members may be provided with a groove where the retainer is disposed.

The barrel guider in contact with the ball member may have a vertical surface.

The housing guider in contact with the ball member may have a vertical surface.

The friction member and the bearing members disposed on both sides thereof may be located on respective vertices of a virtual triangle.

The guiding part may include: a tubular barrel guider disposed on an outer surface of the lens barrel; a housing guider extended from the edge of the housing toward the lens barrel; and a bearing member disposed between the tubular barrel guider and the housing guider.

The bearing member may include: a pair of ball members being in point contact with an outer surface of the tubular barrel guider and an outer surface of the housing guider, respectively; and a retainer having a ball receiving groove where the ball members are rotatably disposed.

The housing guider may have a groove where the ball members are disposed and the groove has a vertical surface.

The actuator, the output member and the guiding part may be arranged along a virtual line.

The piezoelectric body may include a vibrating device having a plurality of piezoelectric ceramic sheets stacked to produce a flexural mode in a length direction and a bending mode in a thickness direction, upon application of power.

The output member may be fixed to an outer surface of a longer side of the piezoelectric body opposing the lens barrel.

The output member may be fixed to a recess formed on an outer surface of a longer side of the piezoelectric body opposing the lens barrel.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

First Embodiment

Figure 1:
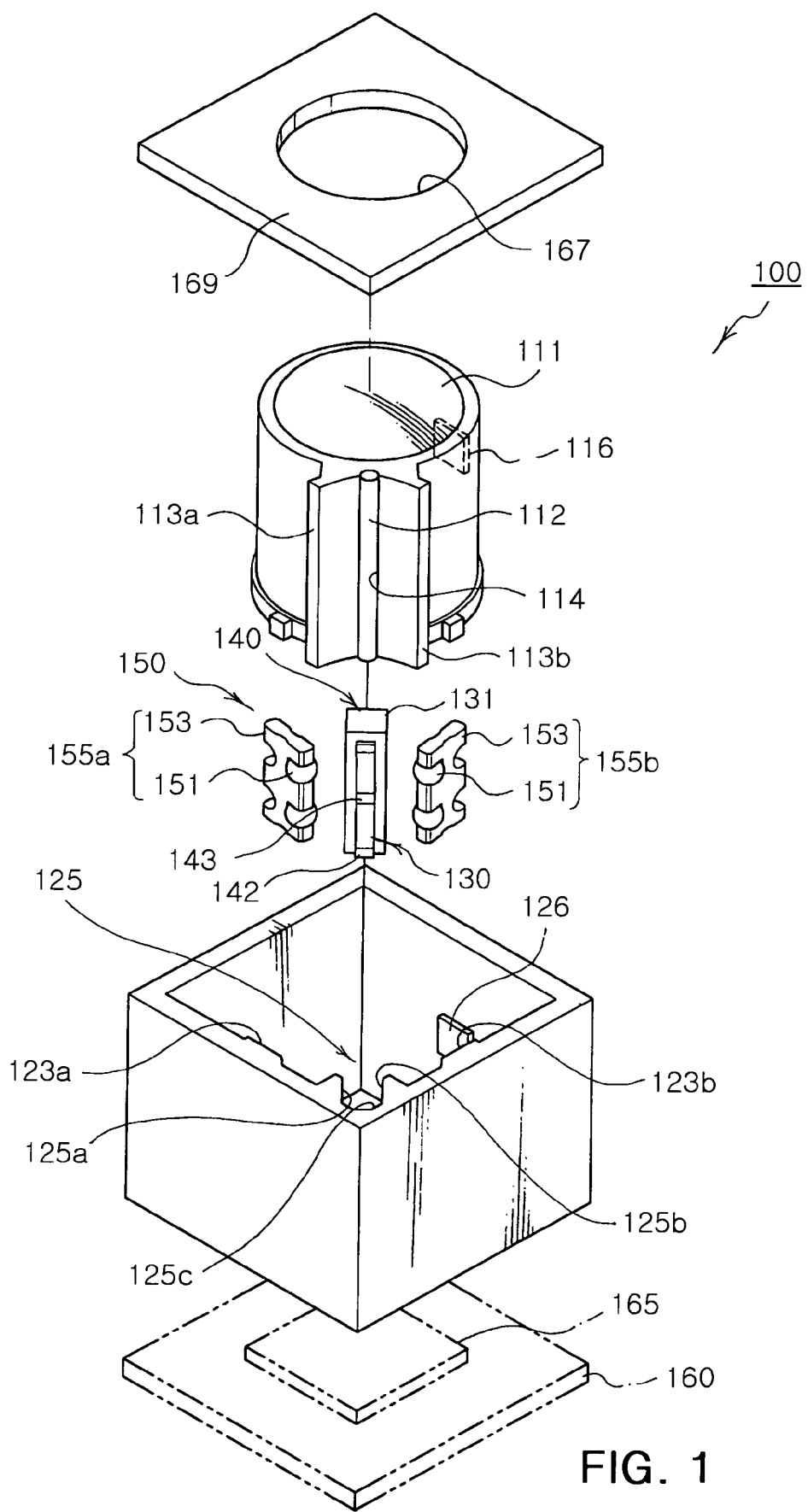
FIG. 1 is an exploded perspective view illustrating a lens driving device according to a first embodiment of the invention.
Figure 2:
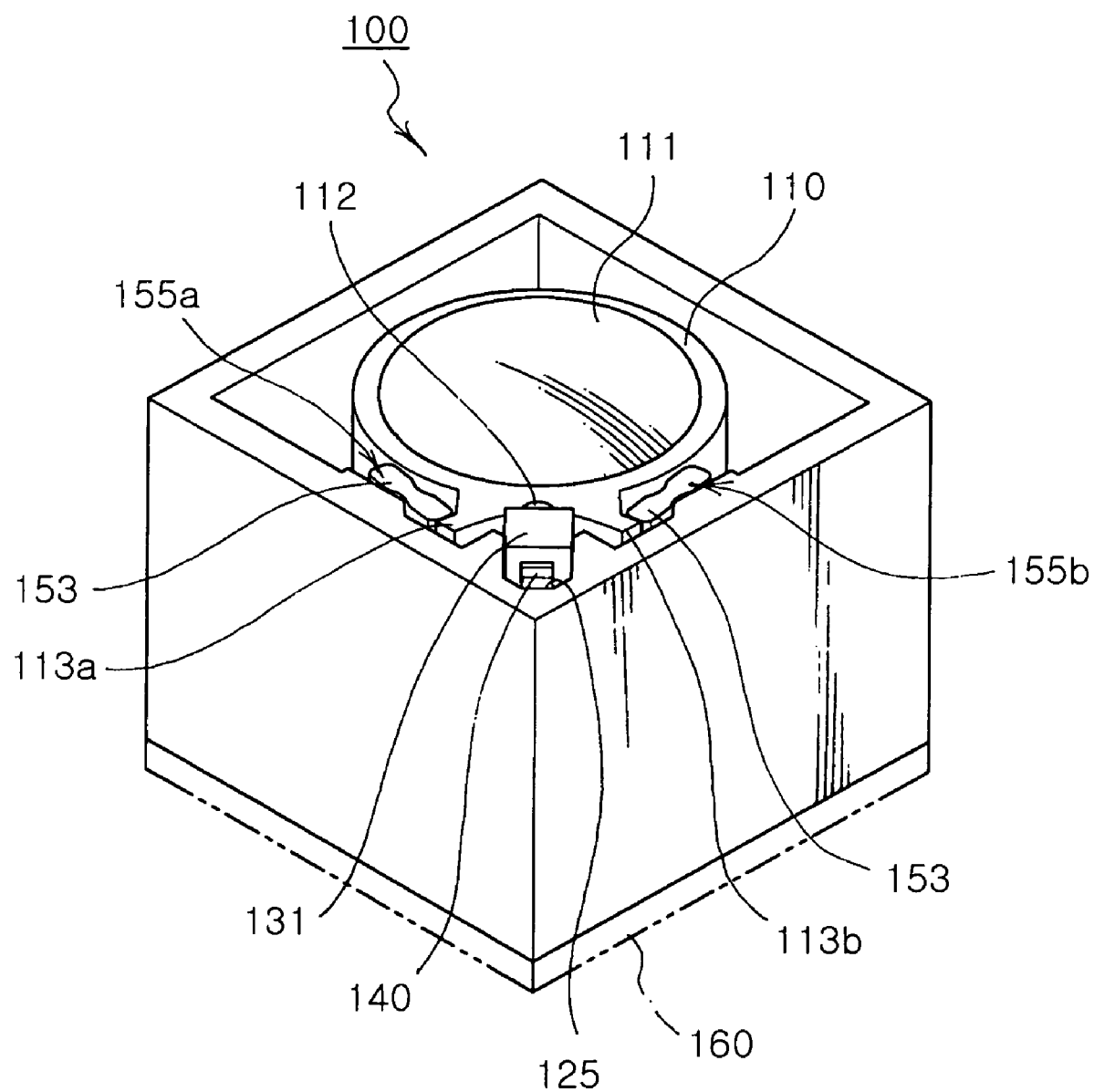
FIG. 2 is an overall configuration view illustrating a lens driving device according to a first embodiment of the invention.
Figure 3:
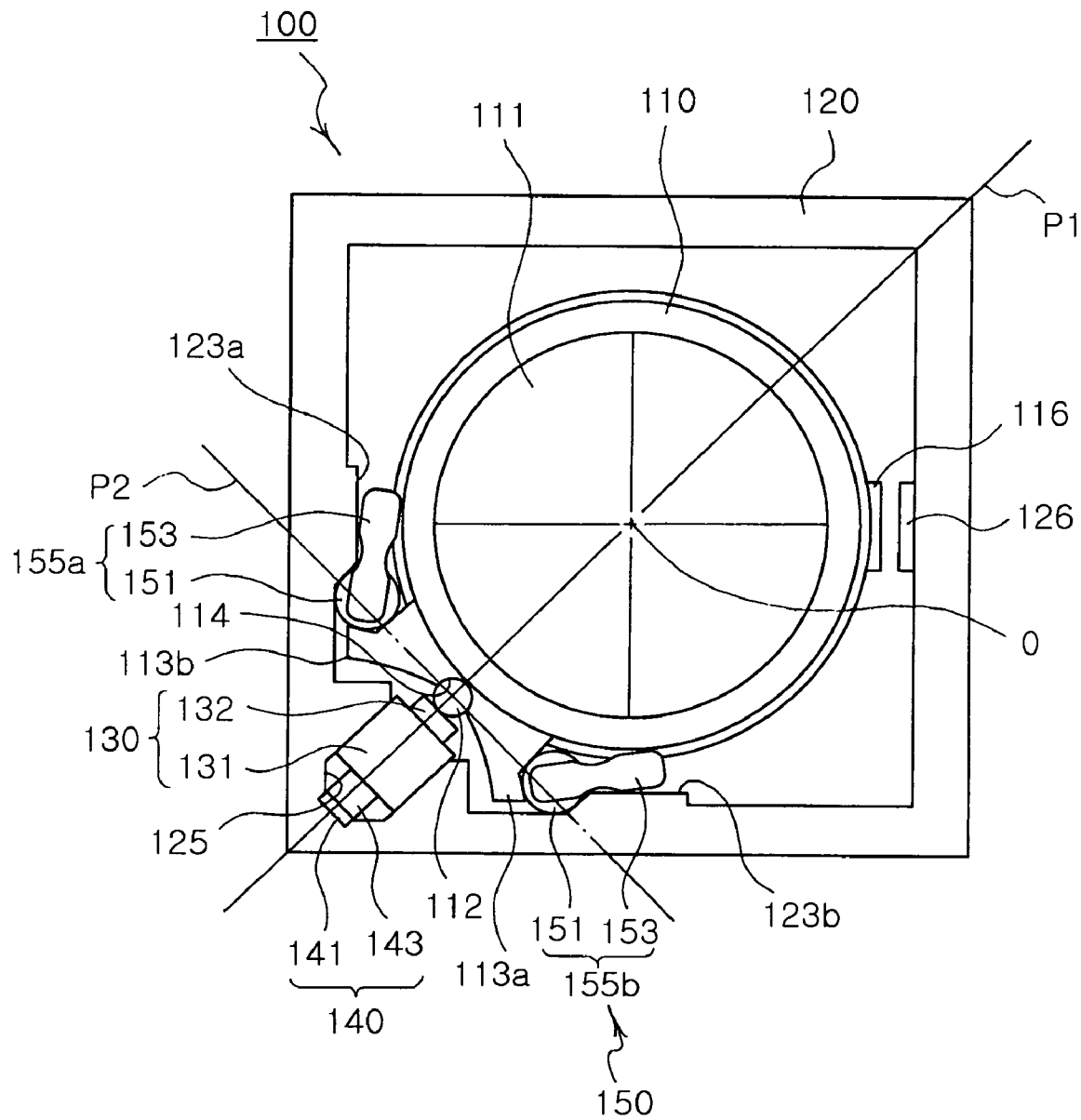
FIG. 3 is a plan view illustrating a lens driving device according to a first embodiment of the invention.

FIG. 1 is an exploded perspective view illustrating a lens driving device according to a first embodiment of the invention. FIG. 2 is an overall configuration view illustrating a lens driving device according to a first embodiment of the invention. FIG. 3 is a plan view illustrating a lens driving device according to a first embodiment of the invention.

The lens driving device 100 of the present embodiment includes a lens barrel 110, a housing 120, an actuator 130, a preload member 140 and a guiding part 150.

Lens Barrel

As shown in FIGS. 1 to 3, the lens barrel 110 has an inner space of a certain size for housing at least one lens 111 along an optical lens.

A friction member 112 of a predetermined length is formed on an outer surface of the lens barrel 110 and is adherently fixed to a groove 114 formed vertically in the outer surface of the lens barrel 110.

Here, the friction member 112 may be formed of alumina, ceramic or a metallic material such as super alloy and high speed steel having excellent wear resistance and a relatively large friction coefficient. The shape of the friction member 112 is not limited to a cylinder but may be a semicircular cylinder, and a box as long as the shape allows transfer of a frictional force to a corresponding object.

Housing

As shown in FIGS. 1 to 3, the housing 120 is a parallelepiped box having an inner space of a certain size to have the lens barrel 110 therein. The housing is open at a top and bottom thereof.

The housing 120 has four edges and an insertion part 125 is formed at one of the edges corresponding to the friction member 112 of the lens barrel 110. The insertion part 125 has the actuator 130 and the preload member 140 inserted therein.

The insertion part 125 is extended toward the lens barrel 110 and includes a pair of sides 125a and 125b in contact with an outer surface of the actuator 130 and a vertical surface 125c in contact with the preload member 140.

Here, a distance between the sides 125a and 125b may be substantially identical to a thickness of the actuator 130 so as to restrict horizontal movement of the actuator 130 and allow the actuator 130 to move toward the lens barrel 110.

Actuator

As shown in FIGS. 1 to 3, the actuator 130 includes at least one output member 132 disposed in contact with the friction member 112 of the lens barrel 110 to generate a frictional force and a piezoelectric body 131 having the output member 132 formed integrally on one side thereof. The actuator 130 is vertically disposed on the one edge of the housing 120 where the insertion part 125 is formed. Accordingly, the actuator 130 applies a driving force for driving the lens barrel 110, an object of transport, in an optical axis direction with respect to the housing 120, a fixed body, upon application of power.

Here, the piezoelectric body 131 has a plurality of electrode terminals provided on an outer surface thereof. In response to power applied through the electrode terminals, the piezoelectric body 122, which is composed of a plurality of stacked piezoelectric sheets each having particular internal electrodes, produces a flexural mode in a length direction and a bending mode in a thickness direction.

Also, the output member 132 may be fixed to an outer surface of a longer side of the piezoelectric body 131 opposing the lens barrel 110 by a bonding material. Alternatively, the output member 132 may be fixed to a recess formed on the outer surface of the longer side of the piezoelectric body 131 opposing the lens barrel 110 by a bonding material.

Like the friction member 112, the output member 132 may be formed of alumina, ceramic or a metallic material such as super alloy and high speed steel having excellent wear resistance and a relatively large friction coefficient. The shape of the friction member 112 is not limited to a cylinder but may be a semicircular cylinder, and a box as long as the shape allows transfer of a frictional force to a corresponding object.

Preload Member

As shown in FIGS. 1 to 3, the preload member 140 is disposed between the edge of the housing 120 and the actuator. The preload member 140 is an elastomer for applying an elastic force of a certain magnitude by compressing the actuator 130 toward the lens barrel 110 so that the friction member 112 of the lens barrel 110 and the output member 132 of the actuator 130 are kept in contact with each other.

The preload member 140 is of a leaf spring or a coil spring which applies an elastic force toward the actuator 130. As shown in FIGS. 1 to 3, the preload member 140, when formed of at least one leaf spring, comes in contact with a vertical surface 125c of the insertion part 125 formed on the edge of the housing 120 where upper and lower ends 141 and 142 of the preload member 140 are located. Also, the preload member 140 has a central portion 143 bent toward the actuator 130 and brought in contact with the outer surface of the actuator 130.

Here, the preload member 140 structured as a leaf spring is bent in a 'V' cross-sectional shape. A protrusion may be formed on the central portion 143 of the preload member 140 to be in point contact with the outer surface of the actuator 130.

Moreover, the preload member 140 is illustrated to be configured as the leaf spring structure, but not limited thereto. The preload member 140 may be formed of at least one coil spring. In a case where the preload member 140 is formed of a coil spring, the preload member 140 has one end in contact with the vertical surface 125a of the insertion part 125 formed on the edge of the housing 120 and another end in contact with the outer surface of the actuator 130.

In addition, when the preload member 140 is formed of the leaf spring or coil spring, the preload member 140 has one end fixed to the vertical surface 125a of the insertion part 125 or the piezoelectric body 131 of the actuator. This accordingly ensures the preload member 140 as well as the actuator 130 to be more easily inserted in the insertion part 125 of the housing 120.

The preload member 140 is brought in contact with an outer surface of the actuator 130 corresponding to a longitudinal center of the actuator 130. Consequently, the preload member 140 applies an elastic force for elastically and uniformly supporting the actuator 130 toward the lens barrel 110, thereby preventing the actuator 130 disposed in the insertion part 125 from being misaligned.

Guiding Part

As shown in FIGS. 1 to 3, the guiding part 150 is disposed between the edge of the housing 120 corresponding to the insertion part 125 where the actuator 130 is provided and the outer surface of the lens barrel 110. Accordingly, the guiding part 150 guides the lens barrel 110 to move in an optical axis direction by a driving force generated during operation of the actuator 130.

The guiding part 150 includes a pair of bearing members 155a and 155b, and the bearing members 155a and 155b are disposed between a pair of barrel guiders 113a and 113b provided in the lens barrel 110 and a pair of housing guiders 123a and 123b provided in the housing 120, respectively.

The barrel guiders 113a and 113b are protrusions extended in a certain length from the outer surface of the lens barrel 110 toward an inner surface of the housing 120. The barrel guiders 113a and 113b are formed to be horizontally symmetrical about a virtual line P1 passing through the optical axis O.

The housing guiders 123a and 123b are protrusions extended from an inner surface of the housing 120 toward the outer surface of the lens barrel 110. The housing guiders 123a and 123b are formed to be horizontally symmetrical about a virtual line P1 passing through the optical axis O.

Each of the bearing members 155a and 155b includes at least one ball member 151 brought in point contact with an outer surface of the barrel guiders 113a and 113b, and an outer surface of the housing guiders 123a and 123b, and a retainer 153 having a ball receiving groove where the ball member 151 is rotatably disposed.

Here, the barrel guiders 113a and 113b are not in contact with the inner surface of the housing 110 and the housing guiders 123a and 123b are not in contact with the outer surface of the lens barrel 110. The barrel guiders 113a and 113b and the housing guiders 123a and 123b contact each other via the ball members 151 of the bearing members 155a and 155b.

The barrel guiders 113a and 113b and the housing guiders 123a and 123b in contact with the ball member 151 are formed of a vertical surface, respectively, thus minimized in frictional resistance with the bearing members 155a and 155b during movement of the lens barrel 110.

Meanwhile, as shown in FIG. 3, a contact point among the optical axis O of the lens barrel 110, the friction member 112 and the output member 132 and a contact point between the preload member 140 and the actuator 130 may be located along a virtual line P1. Here, the driving force applied from the actuator 130 is transferred to the friction member 112 through the output member 132 to move the lens barrel 110 back and forth in an optical axis direction while experiencing minimum loss in the driving force during the reciprocal movement.

The lens barrel 110 disposed inside the housing 120 may be minimally spaced from the actuator 140 vertically disposed at one edge of the housing 120, thereby reducing the bulk and size of the device.

Furthermore, the friction member 112 provided on the lens barrel 110 and the bearing members 155a and 155b arranged in symmetry with respect to the friction member 112 may be disposed in a virtual line P2. Here, the driving force applied from the actuator 130 to the friction member 112 is transferred uniformly to both sides of the lens barrel 110, thereby preventing the lens barrel 110 from sideward play.

A location sensor 126 is provided on the inner surface of the housing 120 to irradiate emitted light onto a reflecting surface of a sensing part 116 provided on the outer surface of the lens barrel 110, receive light reflected and sense vertical positional change of the sensing part, thereby sensing a movement amount of the lens barrel 110.

The location sensor 126 is electrically connected to a cable (not illustrated) for applying a power and transferring a sensing signal.

Also, the housing 120 is provided on a top thereof with a cover 169 having an opening 167 of a certain size perforated to expose a lens 111 of the lens barrel 110 to the outside. The cover 169 serves to protect the lens barrel 110, the actuator 130, the preload member 140 and the guiding part 150 disposed inside the housing 120 from external environment.

Moreover, the housing 120 is provided on a bottom thereof with a board 160 where an image sensor 165 is mounted to image light passed through the lens 111 of the lens barrel 110.

Second Embodiment

Figure 4:
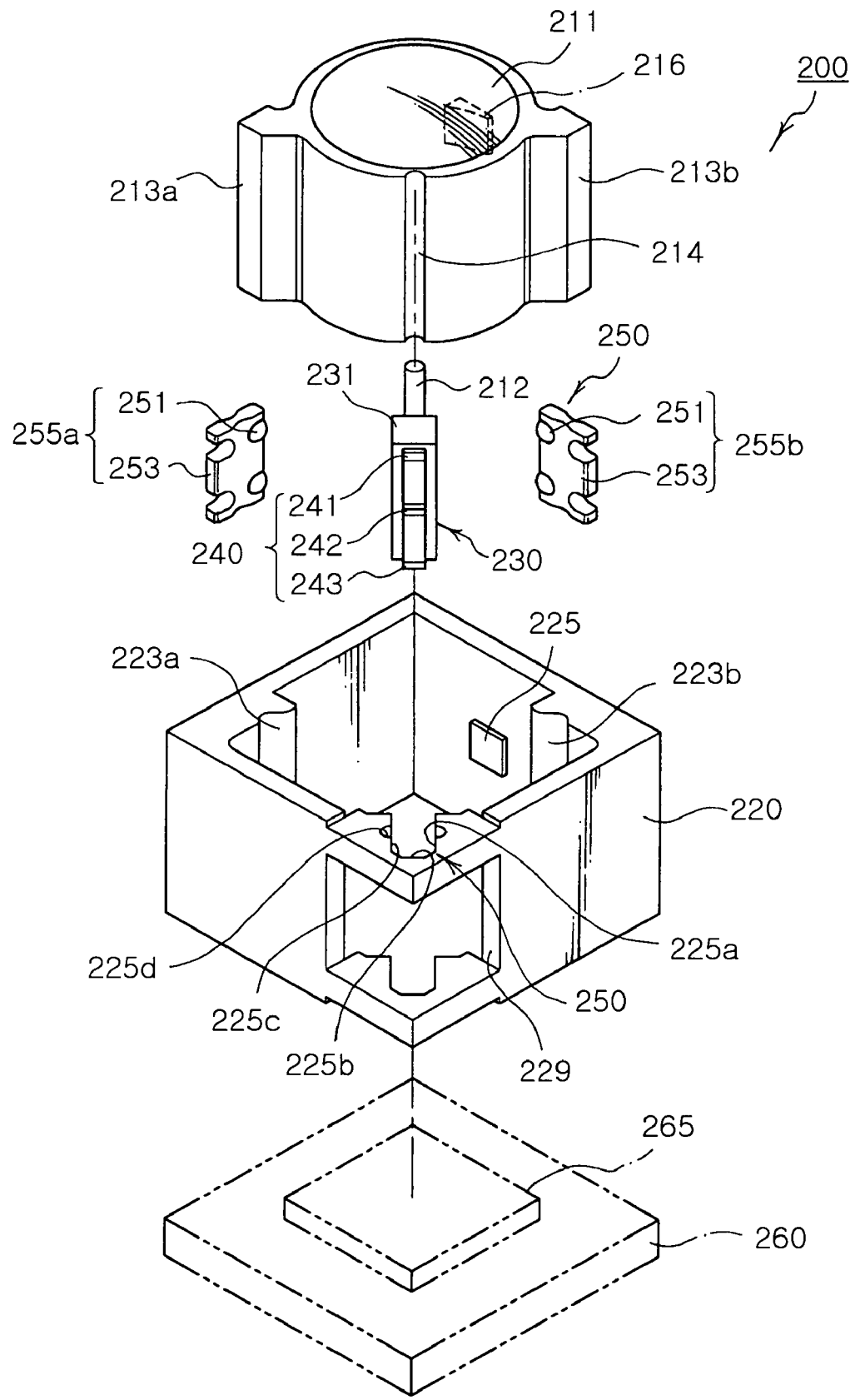
FIG. 4 is an exploded perspective view illustrating a lens driving device according to a second embodiment of the invention.
Figure 5:
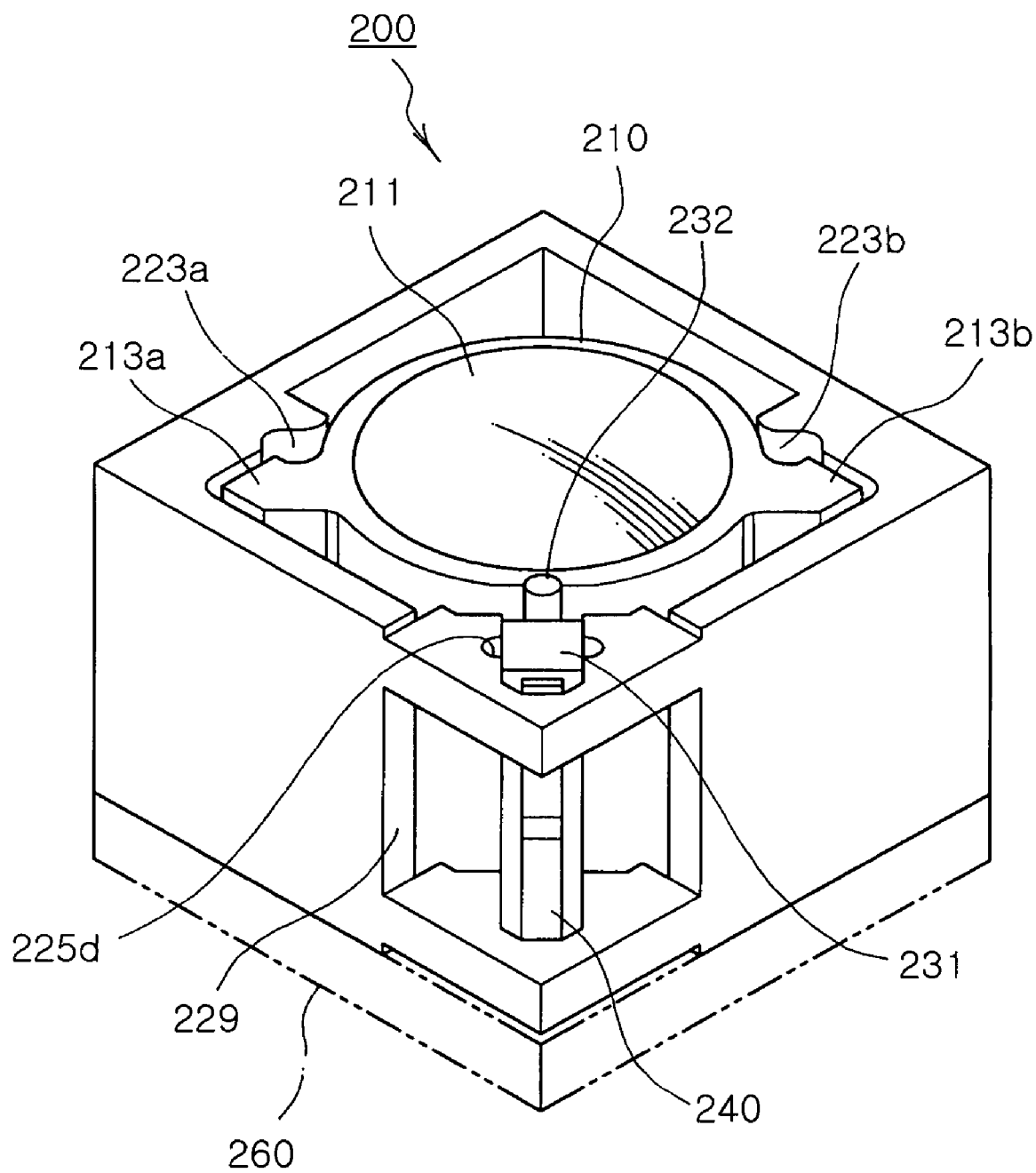
FIG. 5 is an overall configuration view illustrating a lens driving device according to a second embodiment of the invention.

FIG. 4 is an exploded perspective view illustrating a lens driving device according to a second embodiment of the invention. FIG. 5 is an overall configuration view illustrating a lens driving device according to a second embodiment of the invention and FIG. 6 is a plan view illustrating a lens driving device according to a second embodiment of the invention.

Figure 6:
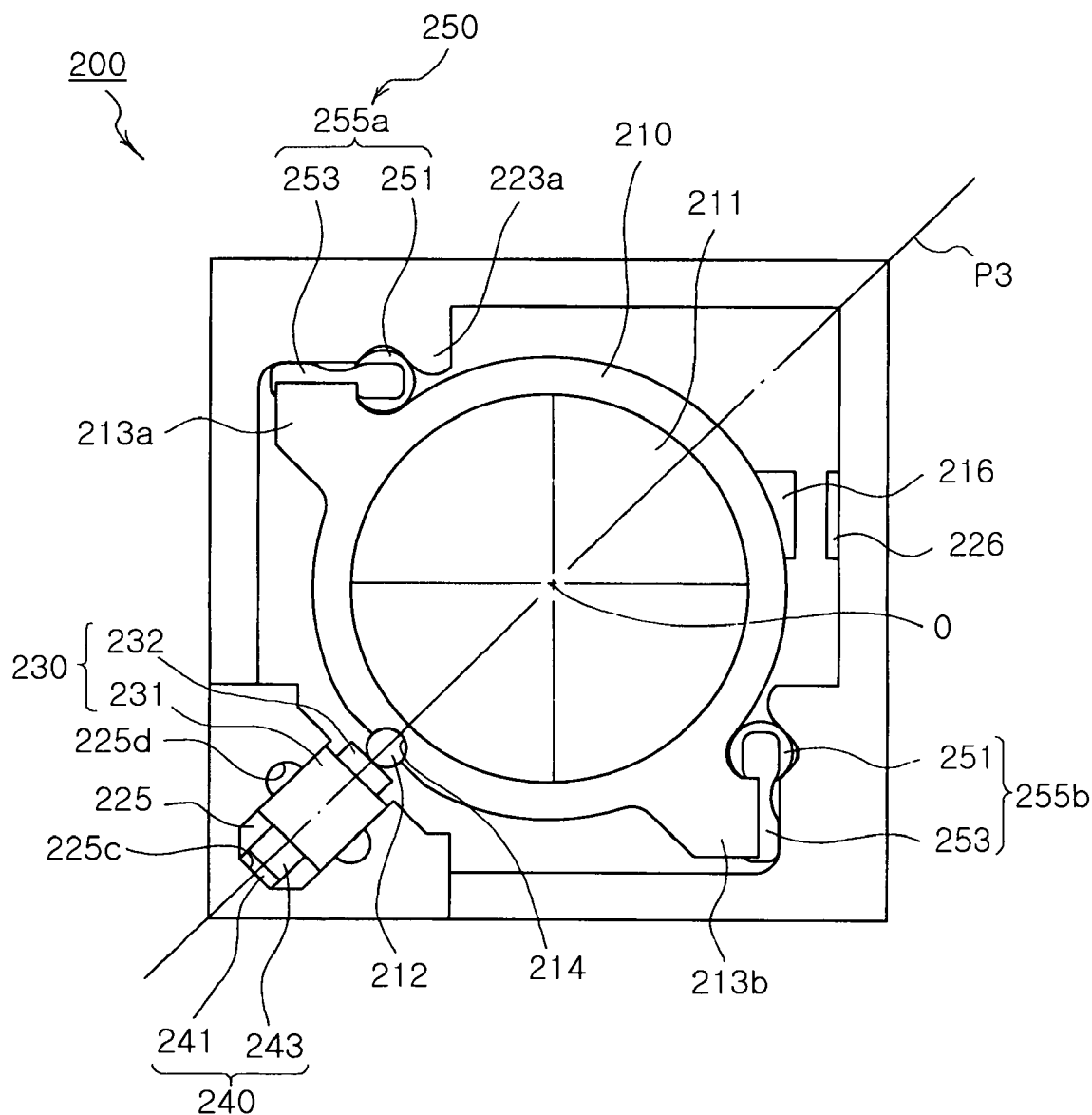
FIG. 6 is a plan view illustrating a lens driving device according to a second embodiment of the invention.

As shown in FIGS. 4 to 6, the lens driving device 200 includes a lens barrel 210, a housing 220, an actuator 230, a preload member 240 and a guiding part 250.

Here, components of the lens driving device 200 of the second embodiment that are identical to those of the previous embodiment, will be explained in no further detail and designated with numerals 20X.

Lens Barrel

As shown in FIGS. 4 to 6, the lens barrel 210 has at least one lens 211 arranged therein along an optical axis, and a groove 214 formed vertically on an outer surface thereof to have a friction member 212 of a certain length disposed thereon.

Housing

As shown in FIGS. 4 to 6, the housing 220 is a parallelepiped box with four edges and has the lens barrel 210 in an inner space thereof.

An insertion part 225 is formed on one of the edges corresponding to the friction member 212 of the lens barrel 210. The insertion part 225 has the actuator 230 and the preload member 240 inserted therein. The insertion part 225 includes a pair of sides 225a and 225b in contact with an outer surface of the actuator 230 and a vertical surface 225c in contact with the preload member 240.

Here, a vertical groove 225d may be formed vertically on the sides 225a and 225b of the insertion part 225 to reduce a contact area with the piezoelectric body 231 of the actuator 230 and thus decrease friction loss.

Moreover, a cut portion 229 of a certain size may be formed on the insertion part 225 to expose the actuator 230 and the preload member to the outside.

Even though not illustrated in the first embodiment, this cut portion 229 and the vertical groove 225d may be formed on the insertion part 125 and the vertical surfaces 125a and 125b of the housing 120 of the first embodiment.

Actuator

As shown in FIGS. 4 to 6, the actuator 230 includes an output member 232 in contact with the friction member 212, and a piezoelectric body 231 having the output member 232 provided on one side thereof. The actuator 230 is vertically disposed at the one edge of the housing 220 where the insertion part 225 is formed. Accordingly, the actuator 230 applies a driving force for driving the lens barrel 210, an object of transport, in an optical axis direction with respect to the housing 220.

Preload Member

As shown in FIGS. 4 to 6, the preload member 240 is disposed in the insertion part 225 where the actuator 230 is disposed. The preload member 240 is an elastomer for applying an elastic force of a certain magnitude by compressing the actuator 230 toward the lens barrel 110. The preload member 240 may be formed of one of a leaf spring and a coil spring, in the same manner as the first embodiment.

Guiding Part

As shown in FIGS. 4 to 6, the guiding part 250 is disposed between corresponding opposing ones of the edges of the housing 220 and the outer surface of the lens barrel 210. Accordingly, the guiding part 250 guides the lens barrel 210 to move in an optical axis direction by a driving force generated during operation of the actuator 230.

As described above, the guiding part 250 includes a pair of bearing members 255a and 255b, and the bearing members 255a and 255b are disposed between a pair of barrel guiders 213a and 213b provided in the lens barrel 210 and a pair of housing guiders 223a and 223b provided in the opposing edges of the housing 220, respectively.

The barrel guiders 213a and 213b are protrusions extended in a certain length from the outer surface of the lens barrel 210 toward the opposing edges of the housing 220, respectively. The barrel guiders are formed to be horizontally symmetrical about an optical axis O of the lens barrel 210.

The housing guiders 223a and 223b are protrusions extended from the opposing edges of the housing 220 to the outer surface of the lens barrel 210, respectively. The housing guiders 223a and 223b are formed to be horizontally symmetrical about a virtual line P3 passing through the optical axis O.

Each of the bearing members 255a and 255b includes at least one ball member 251 brought in contact with an outer surface of the barrel guiders 213a and 213b, and an outer surface of the housing guiders 223a and 223b, and a retainer 253 having a ball receiving groove where the ball member 251 is rotatably disposed.

The barrel guiders 213a and 213b opposing the bearing members 255a and 255b have grooves 213c formed in outer surfaces thereof to have the retainers 253 disposed therein. The grooves 213c are formed higher than the retainers.

Here, the barrel guiders 213a and 213b are not in contact with an inner surface of the housing 220 and the housing guiders 223a and 223b are not in contact with the outer surface of the lens barrel 210, but contact each other via the ball members 251 of the bearing members 255a and 255b.

Meanwhile, as shown in FIG. 6, a contact point among the optical axis O of the lens barrel 210, the friction member 212 and the output member 232 and a contact point between the preload member 240 and the actuator 240 may be arranged on a virtual line P3 as shown in FIG. 6. Here, the driving force applied from the actuator 230 is transferred to the friction member 212 through the output member 232 to move the lens barrel 210 back and fourth in an optical axis direction while experiencing minimum loss in the driving force during the reciprocal movement.

Also, the friction member 212 provided on the lens barrel 210 and the bearing members 255a and 255b provided on the opposing edges of the housing 220 may be located on respective vertices of a virtual triangle. Here, the driving force applied from the actuator 230 to the friction member 212 is transferred to the actuator 230 uniformly, thereby preventing the lens barrel 210 from being misaligned with respect to the friction member 21.

A location sensor 226 is provided on the housing 220 to sense vertical positional change of a sensing part 216 provided on the lens barrel 210.

Moreover, the housing 220 is provided on a top thereof with a cover having an opening of a certain size perforated. The housing 220 is provided on a bottom thereof with a board 260 where an image sensor 265 is mounted.

Third Embodiment

Figure 7:
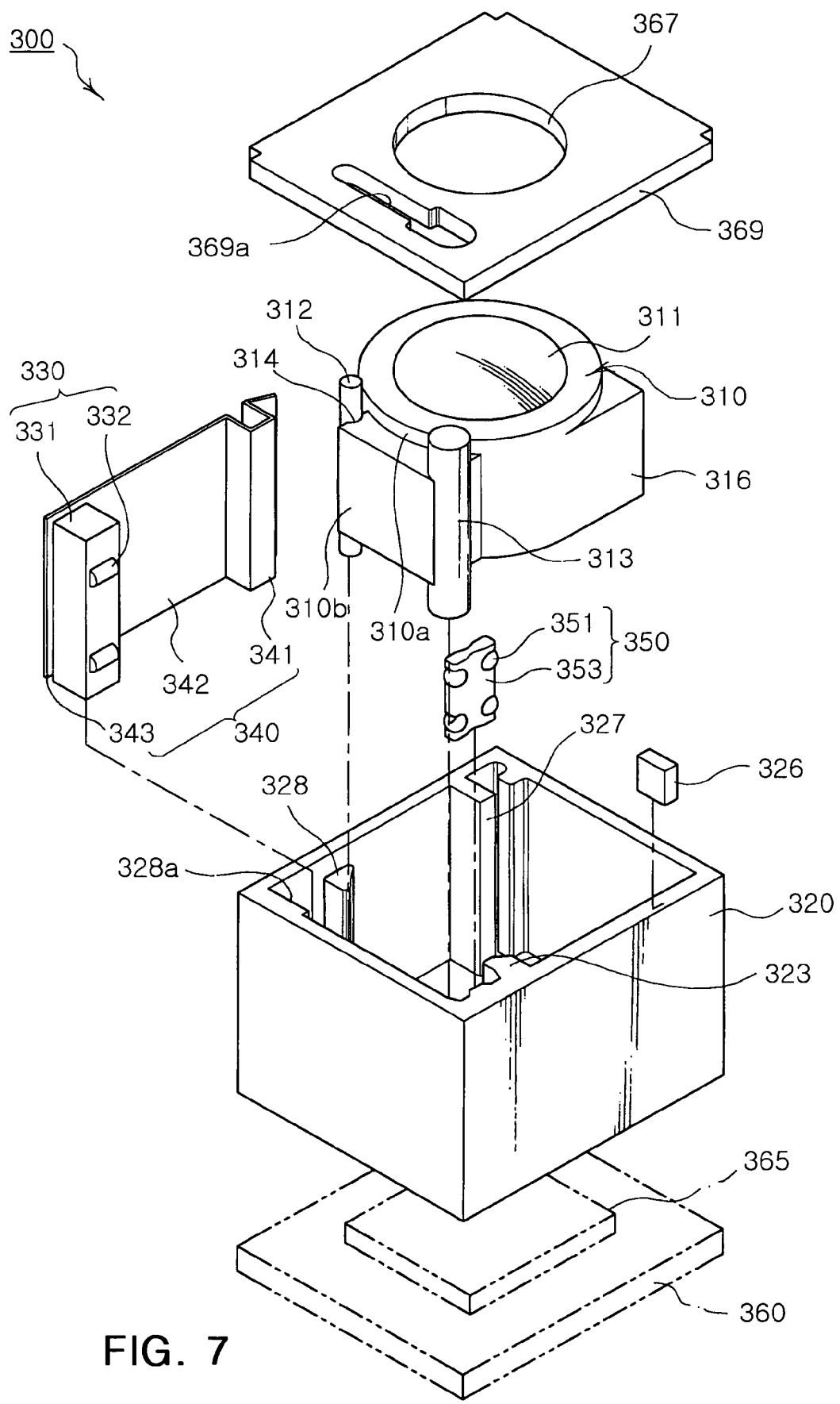
FIG. 7 is an exploded perspective view illustrating a lens driving device according to a third embodiment of the invention.
Figure 8:
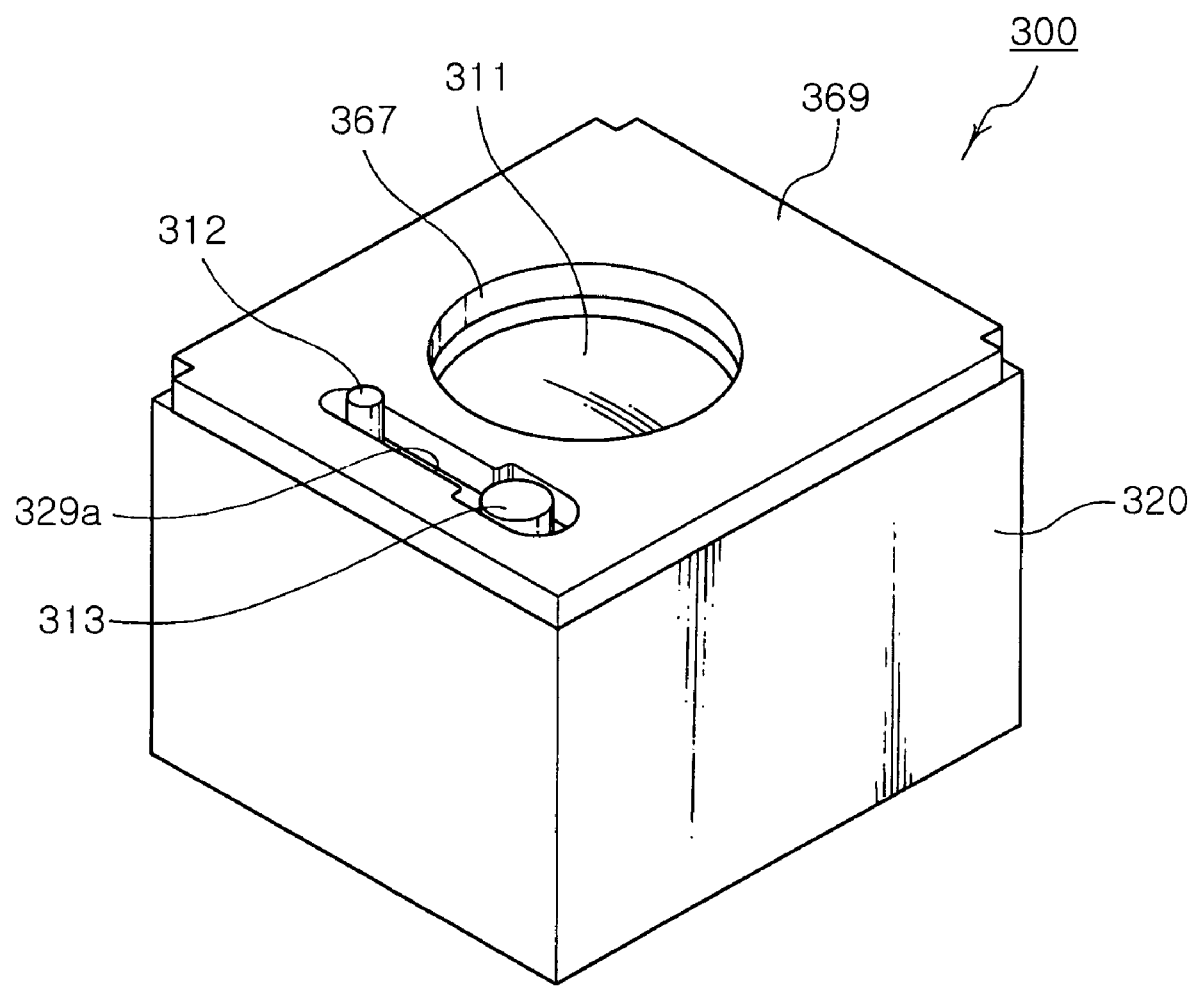
FIG. 8 is an exterior view illustrating a lens driving device according to a third embodiment of the invention.
Figure 9:
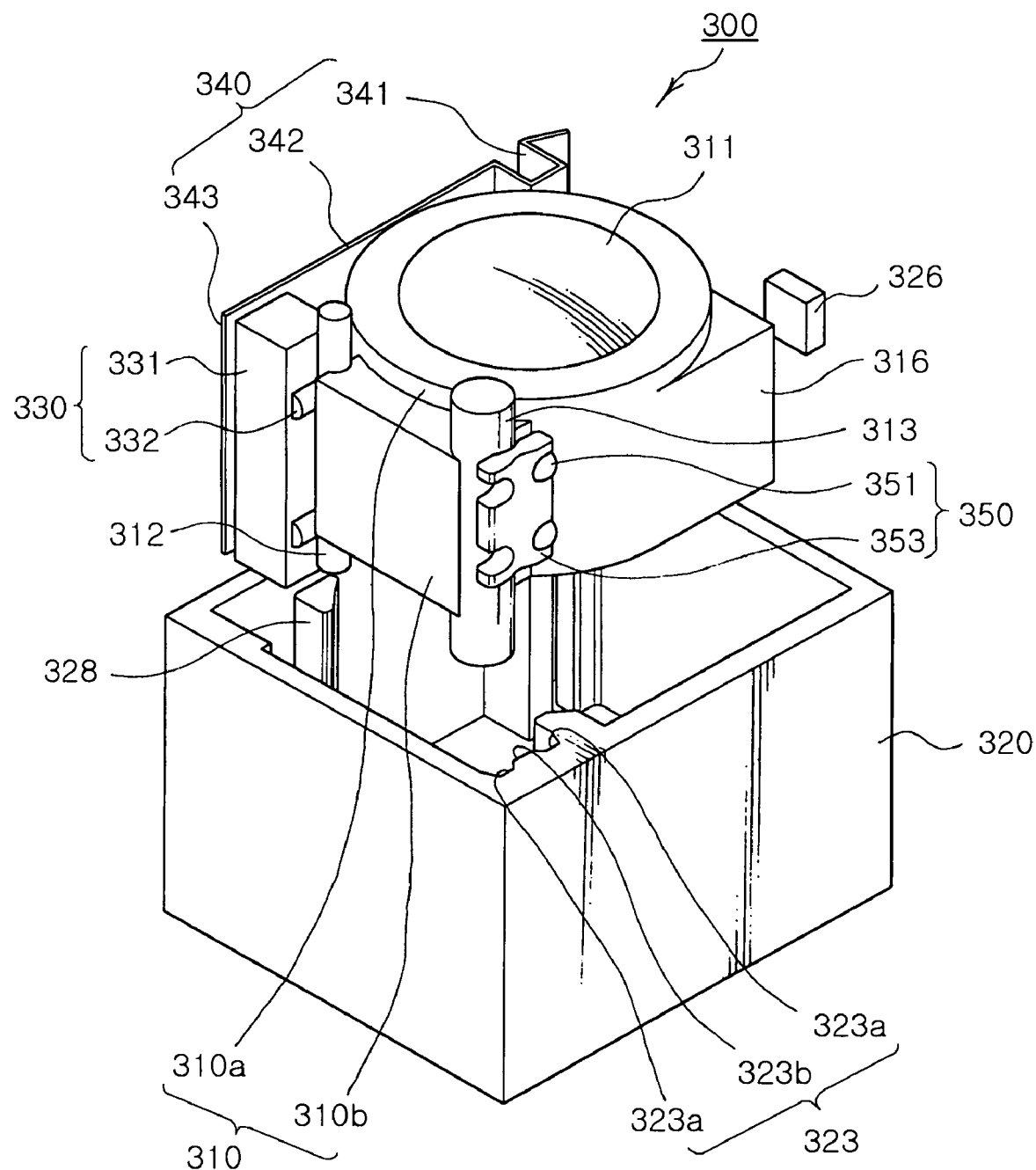
FIG. 9 is a perspective view illustrating a lens driving, seen from the top, according to a third embodiment of the invention.
Figure 10:
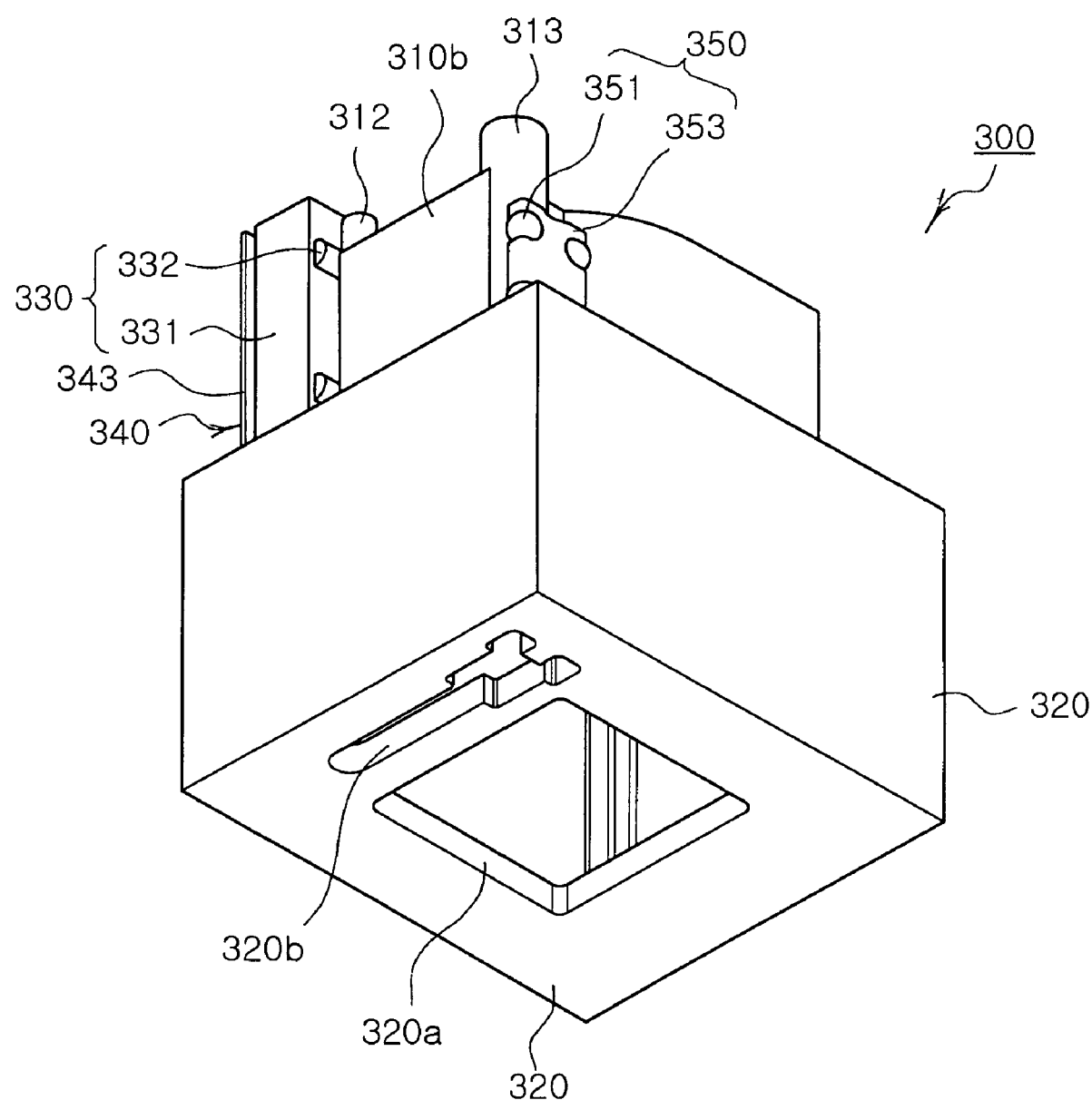
FIG. 10 is a perspective view illustrating a lens driving device, seen from the bottom, according to a third embodiment of the invention.
Figure 11:
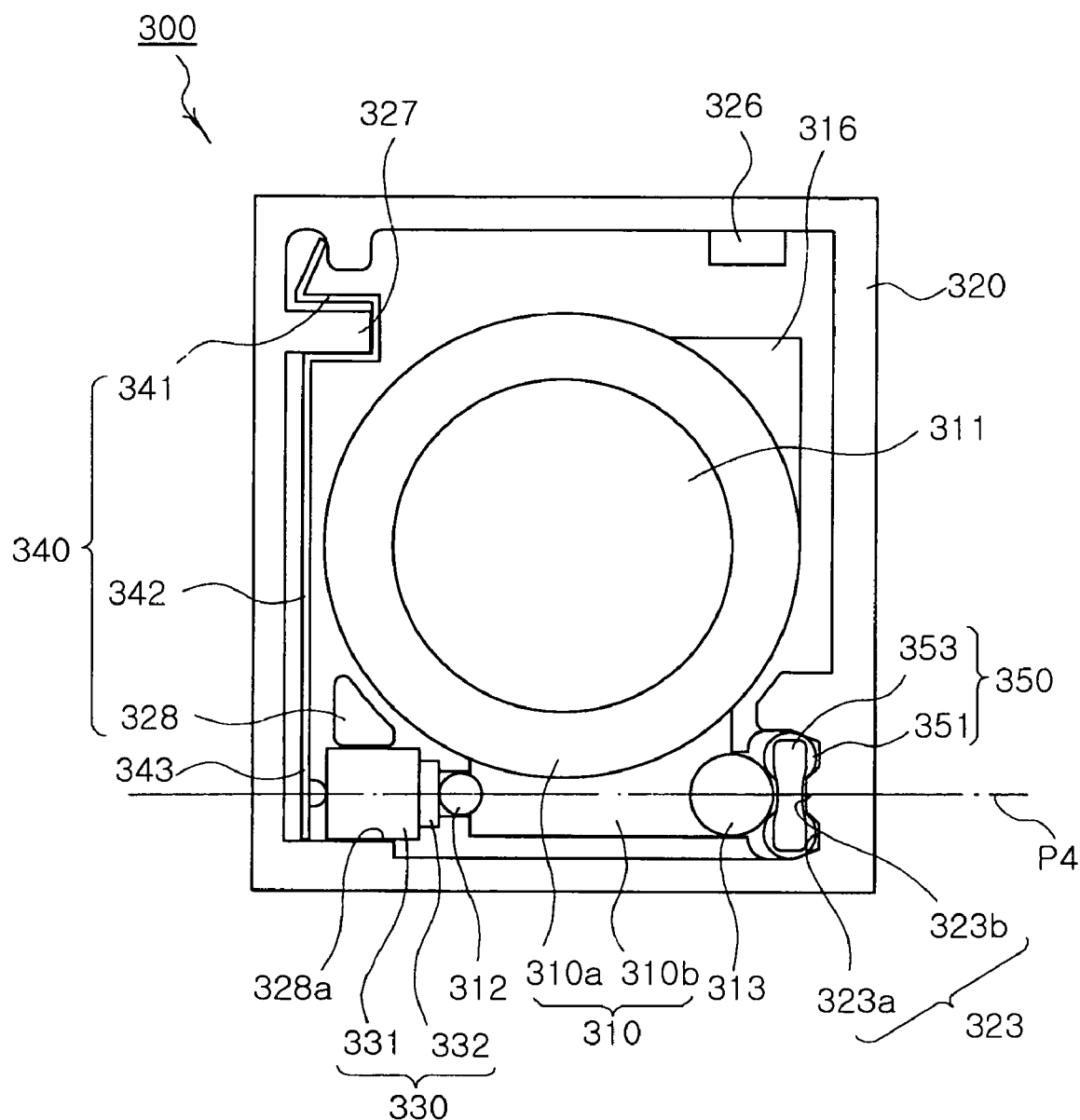
FIG. 11 is a plan view illustrating a lens driving device according to a third embodiment of the invention.

FIG. 7 is a perspective view illustrating a lens driving device according to a third embodiment of the present invention. FIG. 8 is an exterior view illustrating a lens driving device according to a third embodiment of the present invention. FIG. 9 is a perspective view illustrating a lens driving device, seen from the top, according to a third embodiment of the present invention. FIG. 10 is a perspective view illustrating a lens driving device according to a third embodiment of the invention. FIG. 11 is a plan view illustrating a lens driving device according to a third embodiment of the invention.

As shown in FIGS. 7 to 11, the lens driving device 300 includes a lens barrel 310, a housing 320, an actuator 330, a preload member 340 and a guiding part 350.

Here, components of the lens driving device 300 of the third embodiment that are identical to those of the previous embodiment, will be explained in no further detail and designated with numerals 30X.

Lens Barrel

As shown in FIGS. 7 and 9, the lens barrel 310 includes a lens holder 310a having an inner space of a certain size for housing at least one lens 311 therein along an optical axis, and an extension part 310b extended outward from the lens holder 310a.

A friction member 312 of a predetermined length is formed on the extension part 310b opposing one edge of the housing 310. The friction member 312 is adherently fixed to a groove 314 formed vertically in the extension part 310b.

Housing

As shown in FIGS. 7 to 11, the housing 320 is a parallelepiped box with four edges and has the lens barrel 310 disposed in an inner space thereof. The housing 320 is open at a top and provided on a bottom with a first opening 320a for exposing an image sensor 355 of a board 360, which will be described later, and a second opening 320b for exposing a portion corresponding to the extension part 310b.

Furthermore, a vertical rib 328 is formed on the bottom of the housing 320 so that an actuator 330 is inserted between the vertical rib 328 and an inner surface of the housing 320.

Actuator

As shown in FIGS. 7, 9 to 11, the actuator 330 includes an output member in contact with the friction member 312 and a piezoelectric body 331 having the output member formed integrally on one side thereof. The actuator 330 is vertically disposed on one of the four edges of the housing 320. Accordingly, the actuator 330 applies a driving force for driving the lens barrel 310, an object of transport, in an optical axis direction with respect to the housing 320, upon application of power.

The actuator 330 is inserted between the vertical rib 328 vertically provided on the bottom of the housing 320 and the inner surface of the housing 320. Here, a protrusion 328a may be protruded toward the actuator 330 on a portion of the inner surface of the housing 320 corresponding to the vertical rib 328 so that the actuator 330 is more securely inserted between the vertical rib 328 and the inner surface of the housing 320.

Preload Member

As shown in FIGS. 7, 9 to 11, the preload member 340 has one end fixed to another edge of the housing 320 and another end extended in a certain length toward the actuator 330 to be in contact with the actuator 330. The preload member 340 is an elastomer for applying an elastic force of a certain magnitude by compressing the actuator 330 corresponding to the friction member 312 of the lens barrel 310, toward the friction member 312.

The preload member 340 is formed of a leaf spring including a fixed end 341, a resilient plate 342 and a free end 343. The fixed end 341 of the preload member 340 is fixed to another edge adjacent to the edge of the housing 320 where the actuator 330 is disposed. The resilient plate 342 is extended in a certain length from the fixed end 341 to the actuator 330. The free end 343 flexibly contacts an outer surface of the actuator 330.

Here, the fixed end 341 of the preload member 340 may be formed of an insertion groove with an open-square cross-section to fit down into an insertion step 327 formed on the another edge of the housing 320.

In addition, at least one protrusion is protruded from the free end 343 of the preload member 340 to be in point contact with the piezoelectric body 332 of the actuator. Alternatively, the free end 343 may be brought in surface contact with the outer surface of the actuator 330 corresponding to a total length of the piezoelectric body 332.

Guiding Part

As shown in FIGS. 7 to 11, the guiding part 350 is disposed between still another edge of the housing 320 where the actuator 330 and the preload member 34 are not disposed, out of the edges defined by the housing 320, and the lens barrel 310. Accordingly, the guiding part 350 guides the lens barrel 310 to move in an optical axis direction, by a driving force generated during operation of the actuator 230.

The guiding part 350 has a bearing member 355 formed additionally on the still another edge of the housing 320. The bearing member 355 is disposed between a tubular barrel guider 313 provided on the extension part 310b of the lens barrel 310 and a housing guider provided on the still another edge of the housing 320.

The tubular barrel guider 313 is a tubular structure vertically disposed at one side of the extension part 310b of the lens barrel 310. The tubular barrel guider 313 is formed higher than the lens barrel 310. Meanwhile, the friction member 312, when formed at another side of the extension part 310b to oppose the tubular barrel guider 313, has a substantially identical height to the tubular barrel guider 313.

Accordingly, the housing 320 is provided on a bottom thereof with the second opening 320b through which a lower end of the friction member 312 and a lower end of the tubular barrel guider 313 are fitted. Furthermore, a third opening 369a is perforated in the cover 369 covering the open top of the housing 320. Also, an upper end of the friction member 312 and an upper end of the tubular barrel guider 313 are fitted through the third opening 369a.

The bearing member 355 includes a pair of ball members 351 brought in point contact with an outer surface of the tubular barrel guider 313 and the outer surface of the housing guider 323, and a retainer 353 having a ball receiving groove where the ball members 351 are rotatably disposed.

The housing guider 323 protruded from the corresponding edge of the housing is provided with a pair of grooves 323a where the ball members 351 are disposed. A separating portion 323a is provided between the grooves 323a to separate the ball members from each other.

Accordingly, the tubular barrel guider 313 is not in direct contact with the housing guider 323 but contacts the housing guider 323 via the ball members 351.

Here, the grooves 323a formed in the housing guider 323 each may have a vertical surface to be minimized in friction loss from a point contact with the ball member.

As shown in FIG. 11, the actuator 330, the output member 332, the friction member 312 and the guiding part 350 may be arranged along a virtual line P4. Here, the driving force applied from the actuator 330 is transferred to the friction member 312 through the output member 332 to move the lens barrel 310 back and forth in an optical axis direction while experiencing minimum loss in the driving force during the reciprocal movement.

A location sensor 326 is provided on the housing 320 to sense vertical positional change of a sensing part 316 provided in the lens barrel.

Moreover, the housing 320 is provided on a top thereof with a cover 369 having an opening 367 of a certain size and a third opening 369a. The housing 320 is provided on a bottom thereof with the first and second openings 320a and 320b. Also, the housing 320 is provided on the bottom thereof with a board 360 where the image sensor 365 is mounted.

In the lens driving device 100, 200 and 300 of the present invention, the lens barrel 110, 210 and 310 with at least one lens disposed therein is operated back and forth in the optical axis direction by the driving force for moving the lens barrel 110, 210 and 310 generated by longitudinal (flexural) and bending modes of vibration of the piezoelectric body 131, 231 and 331, in response to an external power applied.

That is, when the piezoelectric body of the actuator disposed vertically on the one edge of the housing 120, 220 and 320 is simultaneously driven by the longitudinal and bending modes at a resonant frequency of at least 20 kHz in an ultrasonic region, the output member 132, 232 and 332 attached to a vertical outer surface of the piezoelectric body 131, 231 and 331 corresponding to the friction member 112, 212, and 312 of the lens barrel moves along an elliptical locus or path.

A direction of the elliptical locus movement is determined by voltages applied to internal and external electrodes of the piezoelectric body. This in turn enables adjustment of the transport direction of the lens.

Figure 12:
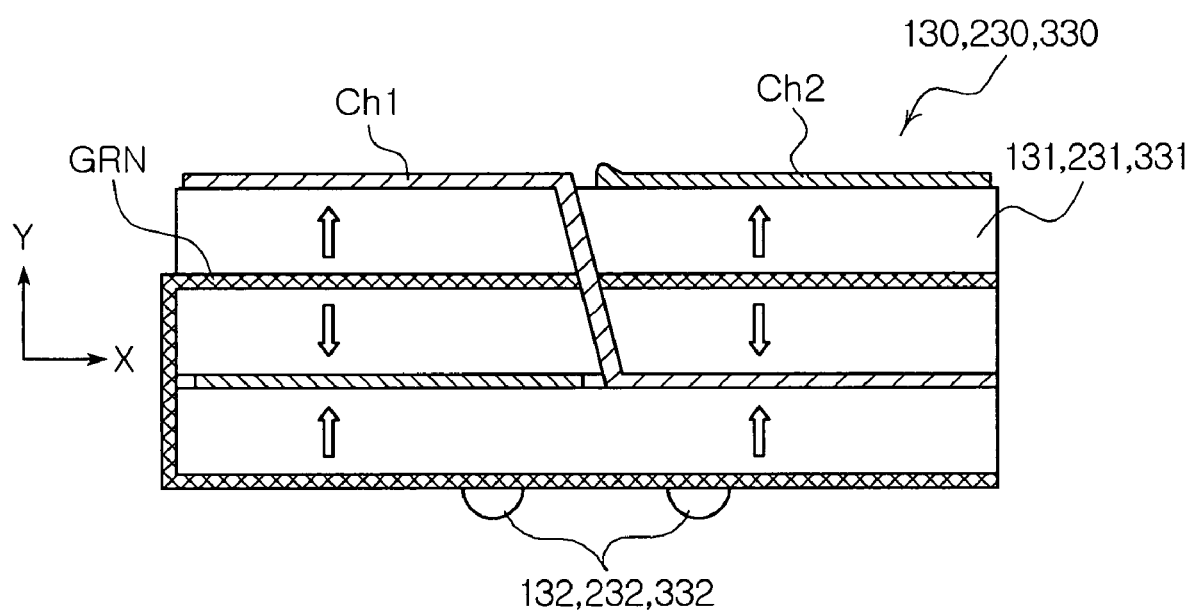
FIG. 12 is a longitudinal sectional view illustrating an actuator employed in a lens driving device according to an exemplary embodiment of the invention.

In a case where the actuator 130, 230 and 330 is formed of three-layer piezoelectric ceramic sheets, as shown in FIG. 12, an upper electrode is divided into channel 1 (Ch1) and channel 2 (Ch2) and a lower electrode forms a ground channel GRN connected to the channel 1 (Ch1) and channel 2 (Ch2).

Figure 13A:
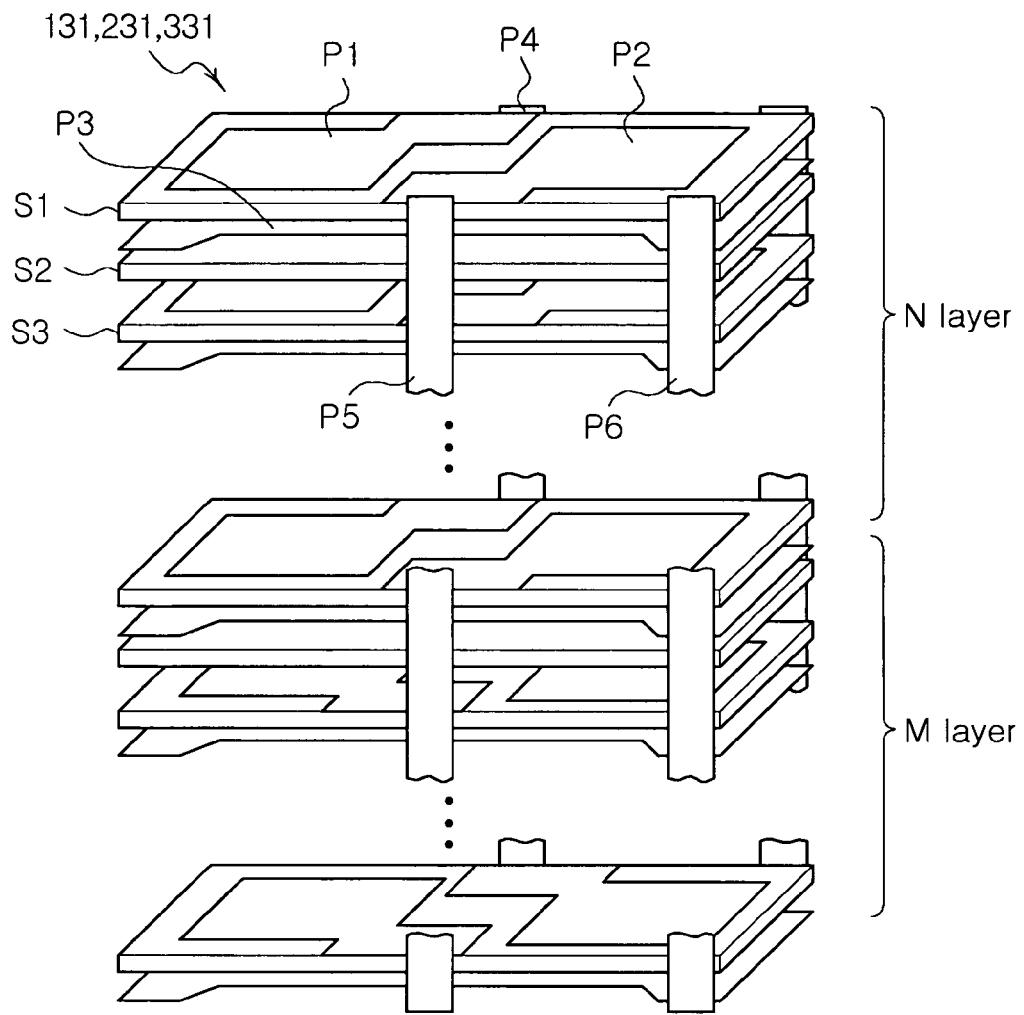
FIG. 13A is an exploded perspective view illustrating an actuator employed in a lens driving device according to an exemplary embodiment of the invention.
Figure 13B:
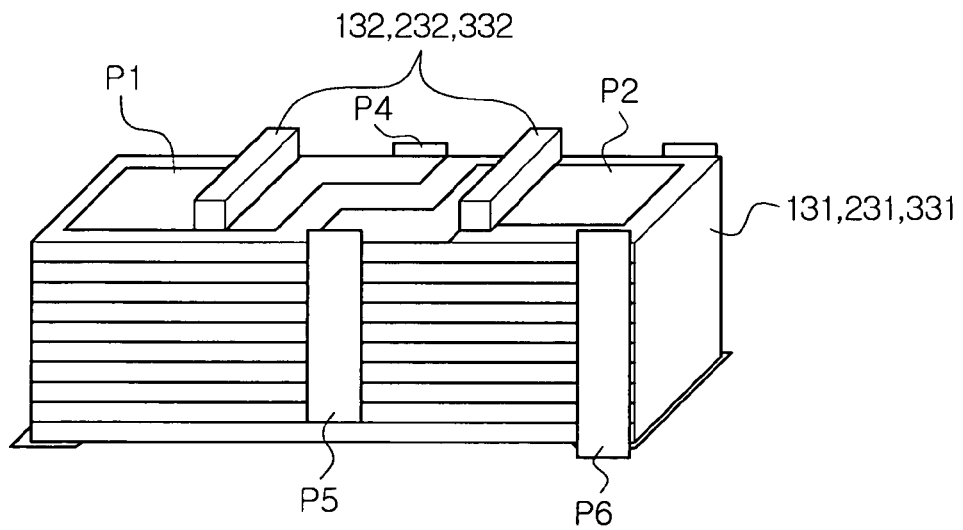
FIG. 13B is an exterior view illustrating an actuator employed in a lens driving device according to an exemplary embodiment of the invention.

Also, as shown in FIG. 13A, in the piezoelectric body 131, 231 and 331 of the actuator 130, 230 and 330, an N-layer is formed by stacking a piezoelectric ceramic sheet S2 with a ground electrode P3 pattern-printed between upper and lower piezoelectric ceramic sheets S1 and S3 having internal electrodes P1 and P2 pattern-printed thereon, respectively. Then, an M-layer with this stack structure is repeatedly stacked to produce the piezoelectric body 131, 231 and 331 having a plurality of piezoelectric sheets stacked alternately as shown in FIG. 13B according to a multilayer ceramic capacitor (MLCC) process.

The piezoelectric body 131, 231 and 331 is provided on an outer surface thereof with external electrodes P4 and P5 electrically connected to the internal electrodes P1 and P2 to constitute the channel 1 Ch1 and the channel 2 Ch2, and an external electrode P6 electrically connected to the ground electrode P3 to constitute a ground channel GRN.

Moreover, the piezoelectric body 131, 231 and 331 with the above structure has at least one output member 132, 232 and 332 integrally bonded to an outer surface of one side thereof. The output member 132, 232 and 332 is brought in contact with the friction member 112, 212 and 312 of the lens barrel 110, 210 and 310 to generate a frictional force, thereby producing the actuator 130, 230 and 330 performing the longitudinal mode and bending mode simultaneously.

The output member 130, 230 and 330 with this construction is a parallelepiped piezoelectric structure having a length of 3 mm, a width of 1.5 mm and a thickness of 0.75 mm. However, this dimension may vary according to a piezoelectric material.

Figure 14:
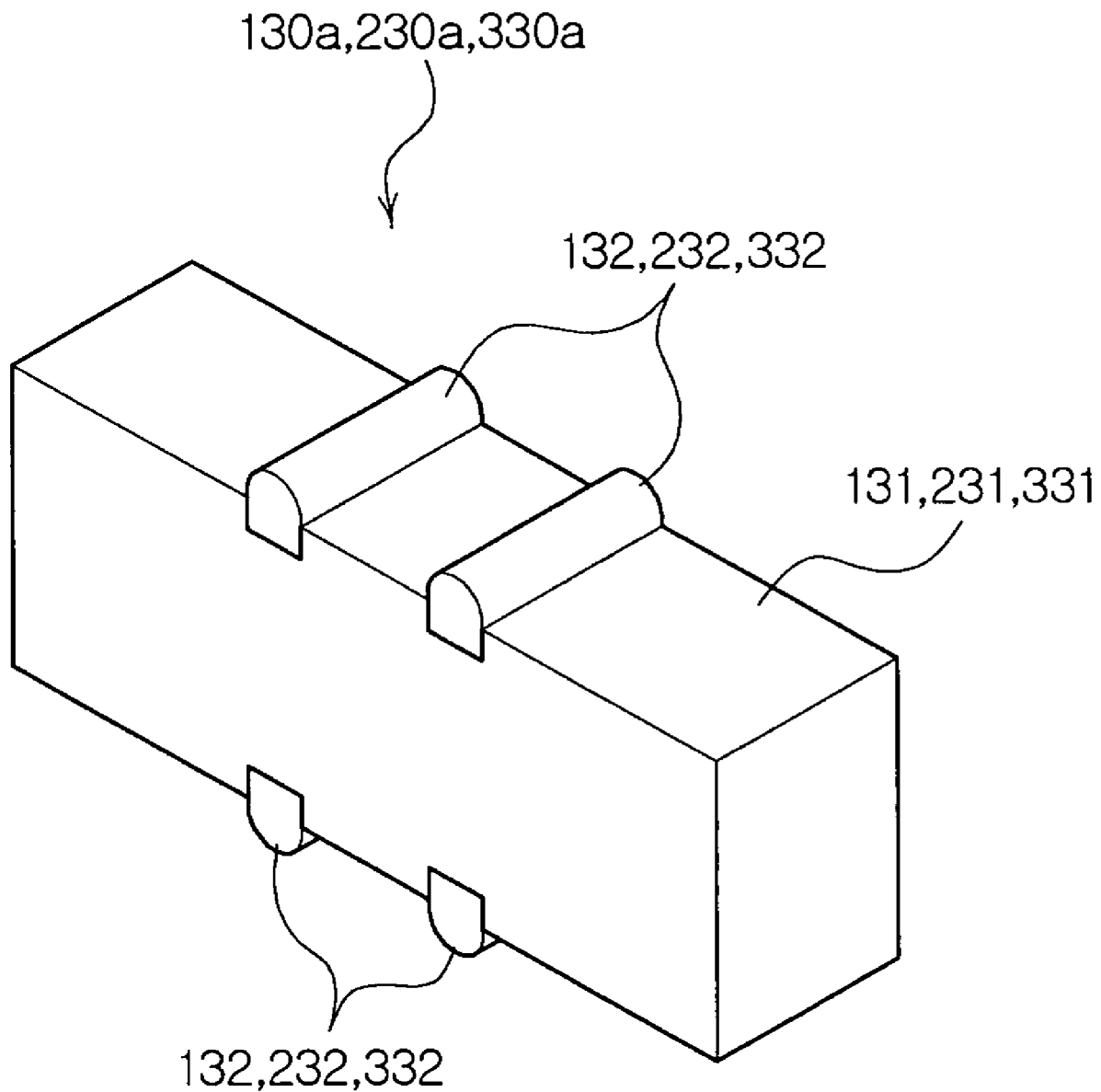
FIG. 14 is an exterior view illustrating an actuator of a different type employed in a lens driving device according to an exemplary embodiment of the invention.

Here, the actuator 130, 230 and 330 has the output member 132, 232 and 332 integrally formed only on the outer surface of one side of the piezoelectric body 131, 231 and 331, however not limited thereto. As shown in FIG. 14, the output members 132, 232 and 332 may be provided on outer surfaces of both sides of the piezoelectric body 131, 231 and 331, respectively to produce an actuator 130a, 230a, and 330a.

Meanwhile, with an electrical signal applied to the channel 1 (Ch1), an upper left piezoelectric ceramic, a middle right piezoelectric ceramic and a lower right piezoelectric ceramic are activated. Also, with an electric signal applied to the channel 2, an upper right piezoelectric ceramic, a middle left piezoelectric ceramic and a lower left piezoelectric ceramic are activated. Therefore, when the power is selectively applied through the channel 1 or 2, the piezoelectric body having multi-layer piezoelectric ceramic sheets performs the longitudinal mode and bending mode. Therefore, the output member provided on the piezoelectric body moves along an elliptical path, making a motion in an upward or downward direction.

Figure 15A:
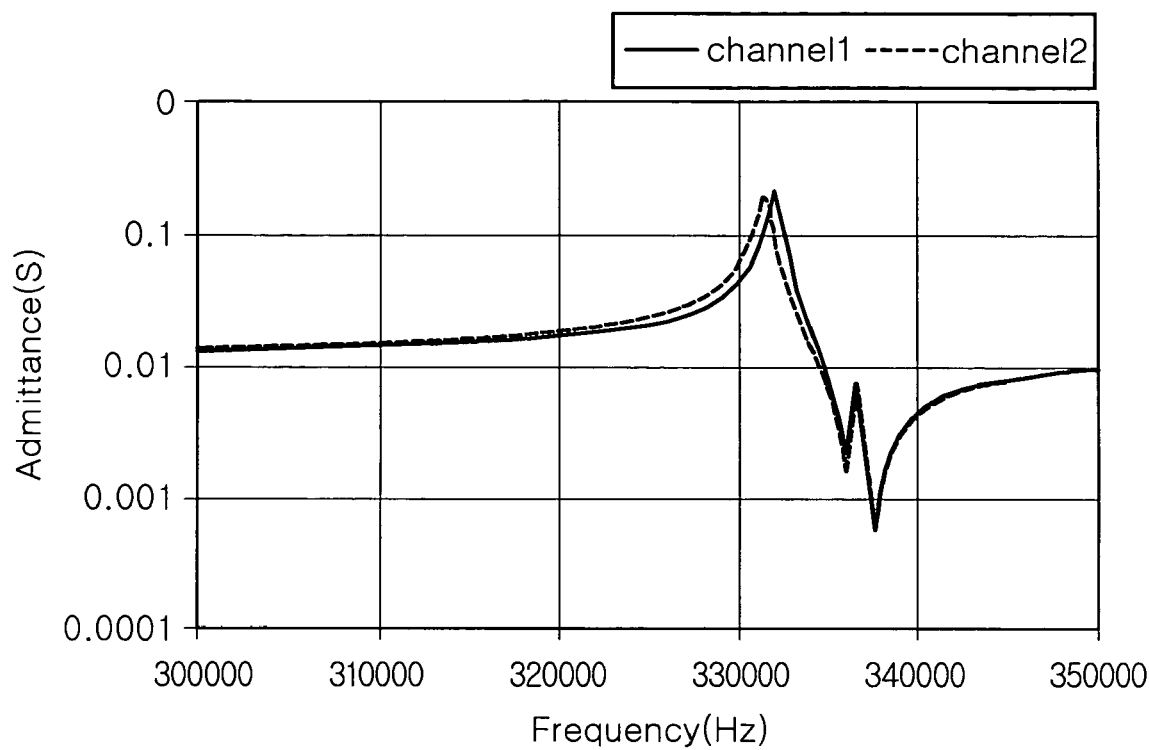
FIG. 15A is a graph illustrating a change in admittance with respect to frequency in an actuator employed in a lens driving device of the present invention.
Figure 15B:
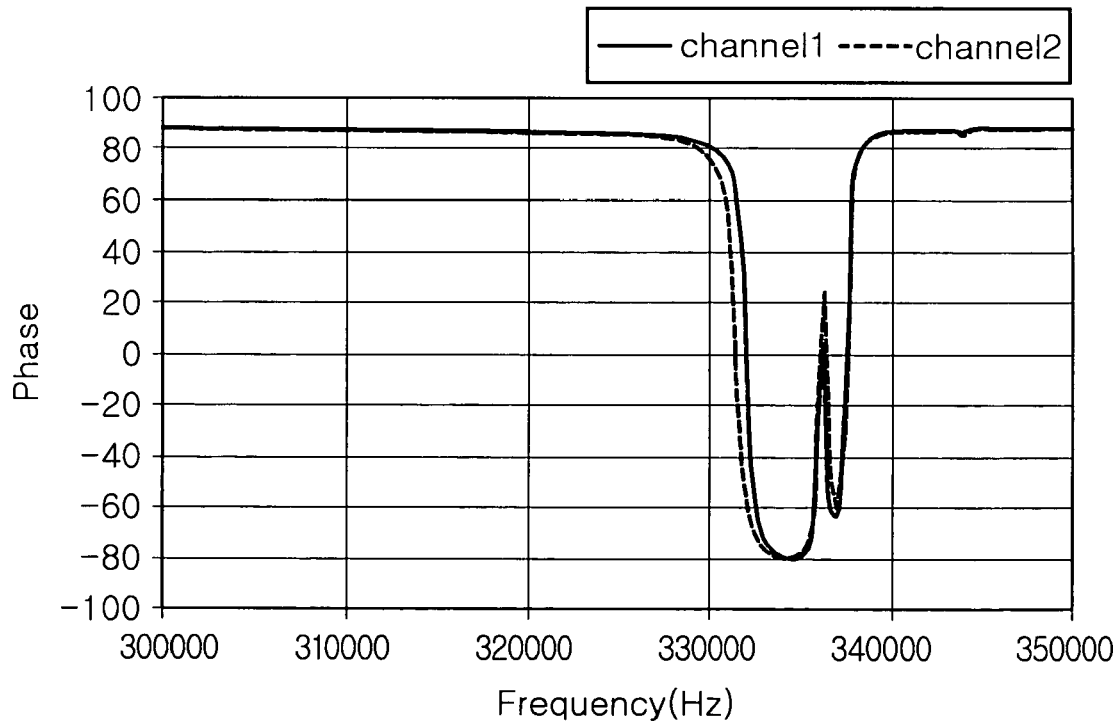
FIG. 15B is a graph illustrating a change in phase with respect to frequency in an actuator employed in a lens driving device of the present invention.

FIG. 15A is a graph illustrating a change in admittance with respect to frequency in an actuator employed in a lens driving device of the present invention. FIG. 15B is a graph illustrating a change in phase with respect to frequency in an actuator employed in a lens driving device of the present invention.

As shown in FIGS. 15A and 15B, for the channel 1 (Ch1) and the channel 2 (Ch), the longitudinal mode has a resonance frequency around 332 kHz and an anti-resonance frequency around 338 kHz. Meanwhile, the bending mode has an anti-resonance frequency around 335 kHz and a resonance frequency around 336 kHz.

Figure 16A:
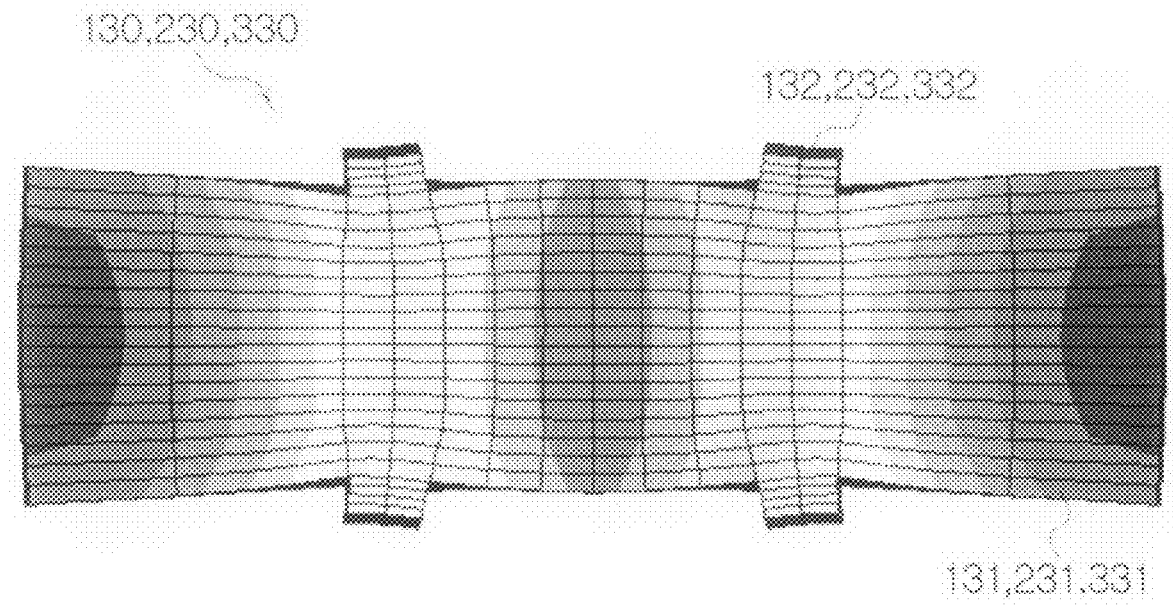
FIGS. 16A and 16B illustrate a longitudinal mode of an actuator employed in a lens driving device of the present invention, at a resonance frequency and an anti-resonance frequency, respectively.
Figure 16B:
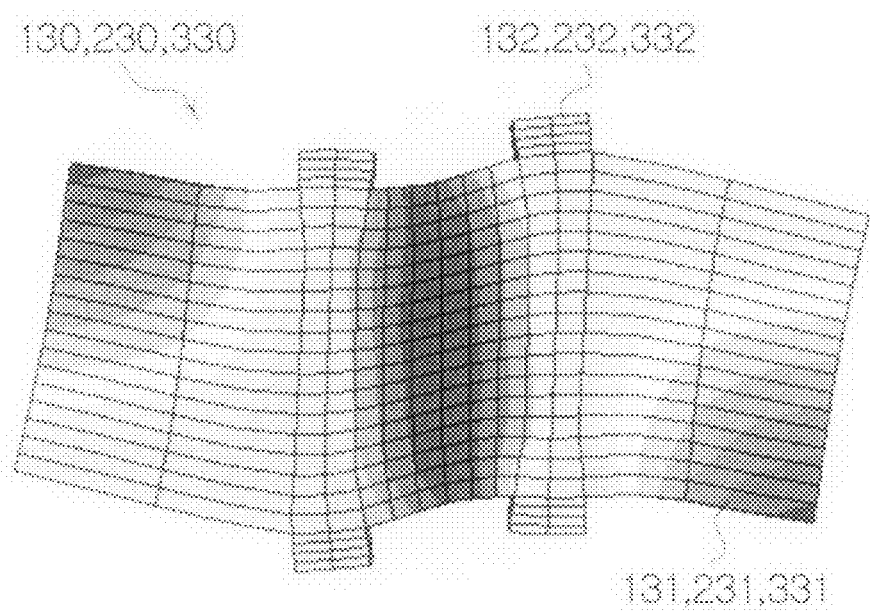
Figure 17A:
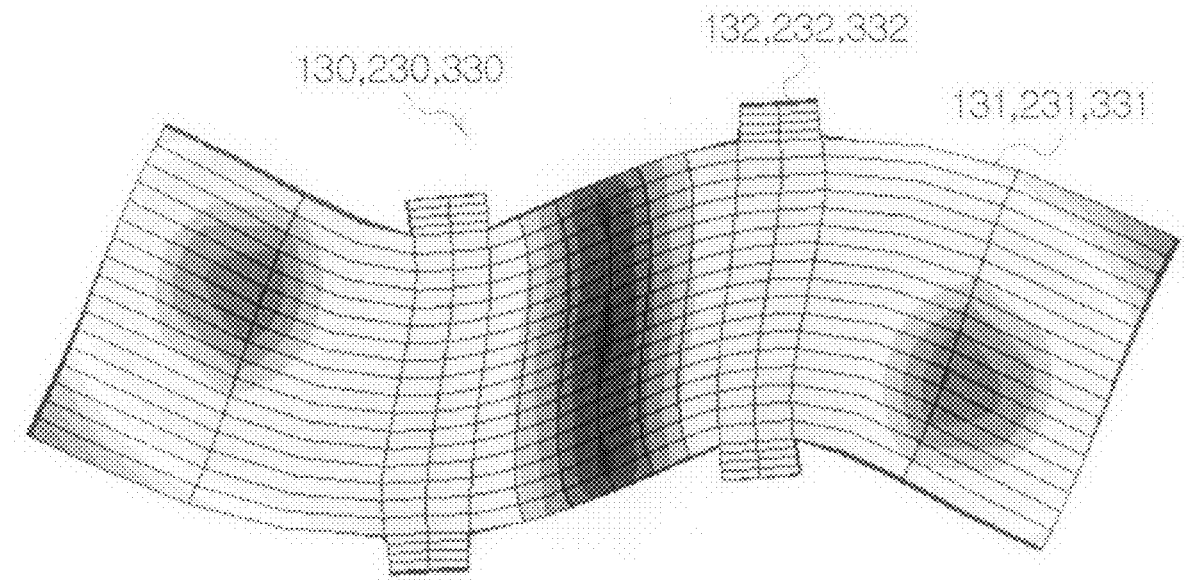
FIGS. 17A and 17B illustrate a flexural mode of an actuator employed in a lens driving device of the present invention at a resonance frequency and an anti-resonance frequency, respectively.
Figure 17B:
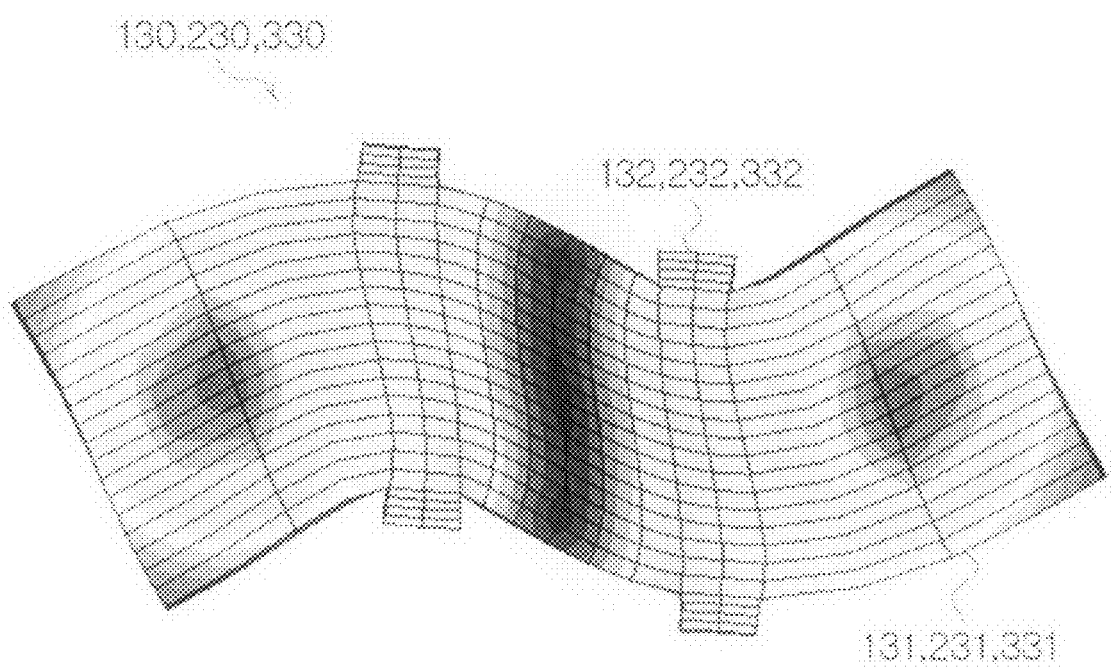

That is, the bending mode is located between the resonance frequency and the anti-resonance frequency of the longitudinal mode, and the resonance frequency of the longitudinal mode and the resonance frequency of the bending mode are kept in close proximity to each other. Thus, the piezoelectric body performs the longitudinal mode upon application of an electrical signal through the channel 1 or 2, as shown in FIG. 16A and 16B. The piezoelectric body performs the bending mode, as shown in FIGS. 17A and 17B.

Furthermore, when the longitudinal mode and the bending mode are performed simultaneously, the output member 132, 232 and 332 provided on the piezoelectric body 131, 231 and 331 moves along an elliptical path, generating a frictional force for moving the friction member in contact therewith in an upward or downward direction.

Here, the actuator 130, 230 and 330 is configured not to move horizontally with respect to the insertion part 125 and 225 or the vertical rib provided at one edge of the housing but only move toward the lens barrel. The output member makes only a linear motion in an upward or downward direction. The direction of the elliptical locus movement is adjusted to an upward or downward direction according to polarity of voltage applied to the piezoelectric body.

Consequently, since the output member transfers a driving force via the friction member provided on the lens barrel, an object of transport, the lens barrel is elevated or lowered along the optical axis direction by the bearing member of the guiding part.

Here, the frictional force generated between the output member and the friction member is greater than the frictional force generated from the bearing member. This allows the lens barrel to move back and forth in an optical axis direction.

Moreover, the output member and the friction member are kept in constant contact with each other by an elastic force of the preload member elastically compressing the piezoelectric body toward the lens barrel.

In addition, the movement of the lens barrel in an optical axis direction is detected by the location sensor for sensing a sensing part of the lens barrel. Based on the detected amount of movement, the lens barrel can move in the optical axis direction by a suitably-controlled driving force of the piezoelectric body.

As set forth above, according to exemplary embodiments of the invention, in a lens driving device, an actuator is vertically disposed at one edge of a housing for housing a lens barrel therein to have an output member in contact with a friction member of a lens barrel. A preload member is provided to compress the actuator toward the lens barrel and a guiding part is provided to guide the lens barrel in an optical axis direction. The lens driving device with this structure has a linear driving mechanism for transferring a driving force of the actuator toward the lens barrel, thereby more simplified in structure than a driving mechanism of e.g., a camcorder or electronic device. This accordingly allows the driving device to be reduced in size.

Moreover, this piezoelectric linear driving mechanism minimizes loss of a driving force transferred to a lens barrel, an object of transport, and also friction-induced loss during transport, thereby achieving a big driving force with low input power and increasing driving efficiency.

In addition, a guiding mechanism for guiding the lens barrel is simplified in structure and the lens can be moved more accurately and stably, thereby ensuring a simpler assembly process and saving manufacturing costs.

While the present invention has been shown and described in connection with the exemplary embodiments, it will be apparent to those skilled in the art that modifications and variations can be made without departing from the spirit and scope of the invention as defined by the appended claims.

What is claimed is:

1. A lens driving device comprising:
   a lens barrel having at least one lens therein and provided with a friction member;
   a housing to house the lens barrel therein;
   an actuator having a piezoelectric body disposed at an edge of the housing to apply a driving force, the piezoelectric body having at least one output member provided at one side thereof to be in contact with the friction member;
   a preload member disposed between the edge of the housing and the actuator to apply an elastic force toward the lens barrel; and
   a guiding part disposed between the housing and the lens barrel to guide the lens barrel to move in an optical axis direction,
   wherein the actuator is longitudinally disposed on the edge of the housing such that the output member is in longitudinal contact with the friction member.

2. The lens driving device of claim 1, wherein the lens barrel has a groove formed in an outer surface thereof corresponding to the output member to have the friction member disposed therein.

3. The lens driving device of claim 1, wherein the housing has an insertion part formed at an edge corresponding to the friction member of the lens barrel to have the actuator and the preload member inserted therein.

4. The lens driving device of claim 1, wherein the preload member comprises at least one leaf spring having upper and lower ends in contact with the edge of the housing and a center bent to contact the actuator.

5. The lens driving device of claim 4, wherein the preload member has a protrusion formed on a center thereof to be in point contact with the actuator.

6. The lens driving device of claim 1, wherein the preload member comprises at least one coil spring having one end in contact with the edge of the housing and another end in contact with the actuator.

7. The lens driving device of claim 1, wherein the preload member has one end fixed to one of the housing and the actuator.

8. The lens driving device of claim 1, wherein the preload member comes in contact with an outer surface of the actuator corresponding to a longitudinal center thereof.

9. The lens driving device of claim 1, wherein the guiding part comprises:
    a pair of barrel guiders extended from an outer surface of the lens barrel toward the housing;
    a pair of housing guiders extended from an inner surface of the housing toward the lens barrel; and
    a pair of bearing members disposed between the barrel guiders and the housing guiders, respectively.

10. The lens driving device of claim 9, wherein each of the bearing members comprises:
    at least one ball member being in point contact with the outer surface of a corresponding one of the barrel guiders and an outer surface of a corresponding one of the housing guiders; and
    a retainer having a ball receiving groove where the ball member is rotatably disposed.

11. The lens driving device of claim 10, wherein the barrel guider in contact with the ball member has a vertical surface.

12. The lens driving device of claim 10, wherein the housing guider in contact with the ball member has a vertical surface.

13. The lens driving device of claim 1, wherein a contact point among an optical axis of the lens barrel, the friction member and the output member and a contact point between the preload member and the actuator are arranged along a virtual line.

14. The lens driving device of claim 1, wherein the friction member and bearing members disposed at both sides thereof are arranged along a virtual line.

15. The lens driving device of claim 1, wherein the housing has a location sensor disposed on an inner surface thereof to detect vertical movement of a sensing part provided on an outer surface of the lens barrel.

16. The lens driving device of claim 1, wherein the housing is provided on a top thereof with a cover having an opening to expose the lens to the outside.

17. The lens driving device of claim 1, wherein the housing is provided on a bottom thereof with a board having an image sensor mounted thereon.

18. The lens driving device of claim 1, wherein the guiding member comprises:
    a pair of barrel guiders extended from an outer surface of the lens barrel toward opposing edges of the housing, respectively;
    a pair of housing guiders extended from the opposing edges of the housing toward the lens barrel, respectively; and
    a pair of bearing members disposed between the barrel guiders and the housing guiders, respectively.

19. The lens driving device of claim 18, wherein each of the bearing members comprises:
    at least one ball member being in point contact with an outer surface of a corresponding one of the barrel guiders and an outer surface of a corresponding one of the housing guiders; and
    a retainer having a ball receiving groove where the ball member is rotatably disposed.

20. The lens driving device of claim 18, wherein the each of the barrel guiders opposing the bearing members is provided with a groove where the retainer is disposed.

21. The lens driving device of claim 19, wherein the barrel guider in contact with the ball member has a vertical surface.

22. The lens driving device of claim 19, wherein the housing guider in contact with the ball member has a vertical surface.

23. The lens driving device of claim 18, wherein the friction member and the bearing members disposed on both sides thereof are located on respective vertices of a virtual triangle.

24. The lens driving device of claim 1, wherein the guiding part comprises:
    a tubular barrel guider disposed on an outer surface of the lens barrel;
    a housing guider extended from the edge of the housing toward the lens barrel; and
    a bearing member disposed between the tubular barrel guider and the housing guider.

25. The lens driving device of claim 24, wherein the bearing member comprises:
    a pair of ball members being in point contact with an outer surface of the tubular barrel guider and an outer surface of the housing guider, respectively; and
    a retainer having a ball receiving groove where the ball members are rotatably disposed.

26. The lens driving device of claim 25, wherein the housing guider has a groove where the ball members are disposed and the groove has a vertical surface.

27. The lens driving device of claim 24, wherein the actuator, the output member and the guiding part are arranged along a virtual line.

28. The lens driving device of claim 1, wherein the piezoelectric body comprises a vibrating device having a plurality of piezoelectric ceramic sheets stacked to produce a flexural mode in a length direction and a bending mode in a thickness direction, upon application of power.

29. The lens driving device of claim 1, wherein the output member is fixed to an outer surface of a longer side of the piezoelectric body opposing the lens barrel.

30. The lens driving device of claim 1, wherein the output member is fixed to a recess formed on an outer surface of a longer side of the piezoelectric body opposing the lens barrel.

31. A lens driving device comprising:
    a lens barrel having at least one lens therein and provided with a friction member;
    a housing to house the lens barrel therein;
    an actuator having a piezoelectric body disposed at an edge of the housing to apply a driving force, the piezoelectric body having at least one output member provided at one side thereof to be in contact with the friction member;
    a preload member disposed between the edge of the housing and the actuator to apply an elastic force toward the lens barrel; and
    a guiding part disposed between the housing and the lens barrel to guide the lens barrel to move in an optical axis direction,
    wherein the guiding part comprises:
        a pair of barrel guiders extended from an outer surface of the lens barrel toward the housing;
        a pair of housing guiders extended from an inner surface of the housing toward the lens barrel; and
        a pair of bearing members disposed between the barrel guiders and the housing guiders, respectively.

32. A lens driving device comprising:
    a lens barrel having at least one lens therein and provided with a friction member;
    a housing to house the lens barrel therein;
    an actuator having a piezoelectric body disposed at an edge of the housing to apply a driving force, the piezoelectric body having at least one output member provided at one side thereof to be in contact with the friction member;
    a preload member disposed between the edge of the housing and the actuator to apply an elastic force toward the lens barrel; and a guiding part disposed between the housing and the lens barrel to guide the lens barrel to move in an optical axis direction, wherein the guiding member comprises:

a pair of barrel guiders extended from an outer surface of the lens barrel toward opposing edges of the housing, respectively;

a pair of housing guiders extended from the opposing edges of the housing toward the lens barrel, respectively; and a pair of bearing members disposed between the barrel guiders and the housing guiders, respectively.

33. A lens driving device comprising:

a lens barrel having at least one lens therein and provided with a friction member;

a housing to house the lens barrel therein;

an actuator having a piezoelectric body disposed at an edge of the housing to apply a driving force, the piezoelectric body having at least one output member provided at one side thereof to be in contact with the friction member;

a preload member disposed between the edge of the housing and the actuator to apply an elastic force toward the lens barrel; and a guiding part disposed between the housing and the lens barrel to guide the lens barrel to move in an optical axis direction, wherein the guiding part comprises:

a tubular barrel guider disposed on an outer surface of the lens barrel;

a housing guider extended from the edge of the housing toward the lens barrel; and a bearing member disposed between the tubular barrel guider and the housing guider.

34. A lens driving device comprising:

a lens barrel having at least one lens therein and provided with a friction member;

a housing to house the lens barrel therein;

an actuator having a piezoelectric body disposed at an edge of the housing to apply a driving force, the piezoelectric body having at least one output member provided at one side thereof to be in contact with the friction member;

a preload member disposed between the edge of the housing and the actuator to apply an elastic force toward the lens barrel; and a guiding part disposed between the housing and the lens barrel to guide the lens barrel to move in an optical axis direction, wherein the piezoelectric body comprises a vibrating device having a plurality of piezoelectric ceramic sheets stacked to produce a flexural mode in a length direction and a bending mode in a thickness direction, upon application of power.

* * * * *